United States Patent [19]
Yaguchi et al.

[11] Patent Number: 5,357,139
[45] Date of Patent: Oct. 18, 1994

[54] PLASTIC ENCAPSULATED SEMICONDUCTOR DEVICE AND LEAD FRAME

[75] Inventors: Akihiro Yaguchi, Ibaraki; Asao Nishimura, Ushiku; Makoto Kitano, Tsuchiura; Ryuji Kohno; Nae Yoneda, both of Ibaraki; Ichiro Anjoh, Koganei; Gen Murakami, Tama, all of Japan

[73] Assignee: Hitachi, Ltd., Tokyo, Japan

[21] Appl. No.: 117,639

[22] Filed: Sep. 8, 1993

Related U.S. Application Data

[63] Continuation of Ser. No. 662,617, Feb. 27, 1991, abandoned.

[30] Foreign Application Priority Data

Feb. 28, 1990 [JP] Japan .................................. 2-45412

[51] Int. Cl.⁵ ...................... H01L 23/50; H01L 23/48
[52] U.S. Cl. .................................. 257/666; 257/668; 257/669; 257/670; 257/675; 257/676
[58] Field of Search ............................ 357/70, 72, 74; 257/666, 668, 669, 670, 675, 676

[56] References Cited

U.S. PATENT DOCUMENTS

| | | | |
|---|---|---|---|
| 4,445,271 | 5/1984 | Grabbe | 357/70 |
| 4,862,245 | 8/1989 | Pashby et al. | 357/70 |
| 4,862,246 | 8/1989 | Masuda et al. | 357/72 |
| 4,916,519 | 4/1990 | Ward | 357/70 |
| 4,951,122 | 8/1990 | Tsubosaki et al. | 357/70 |
| 4,984,065 | 1/1991 | Sako | 357/70 |
| 5,032,895 | 7/1991 | Horiuchi et al. | 357/70 |

OTHER PUBLICATIONS

"Thin Small Outline Package", IBM TDB, vol. 34, No. 1, Jun. 1991, pp. 358–359.

William Ward, "Volume Production of Plastic Modules for Dram Chip by Area Wire Bond Techniques", IBM, IEEE, 1988, pp. 552–557.

Primary Examiner—Viet Q. Nguyen
Attorney, Agent, or Firm—Antonelli, Terry, Stout & Kraus

[57] ABSTRACT

In a package for DRAM, plastic is included between the common signal inner leads (bus bar inner leads) and insulating films arranged in the central part of a semiconductor chip. Thus, the deformation of plastic at the upper edge of the common signal inner leads is reduced and no great stress is generated at this portion. Accordingly, plastic cracking can be prevented.

10 Claims, 11 Drawing Sheets

PLASTIC ENCAPSULATED SEMICONDUCTOR DEVICE AND LEAD FRAME

This application is a continuation of application Ser. No. 662,617, filed on Feb. 27, 1991, abandoned.

BACKGROUND OF THE INVENTION

1. Field of the Invention

The present invention relates to plastic encapsulated semiconductor devices and lead frames, and more particularly to plastic encapsulated semiconductor devices and lead frames best suited for preventing plastic crackings.

2. Description of the Prior Art

Traditionally in a plastic encapsulated semiconductor device, a configuration is employed to fix a semiconductor chip on a chip pad, while, at the same time, a plurality of leads are arranged on the circumference of the chip pad. Fine metal wires connect the leads to the terminals provided on the semiconductor chip and then the circumference thereof being encapsulated with plastic.

In recent years, however, there has been a tendency that the chip size becomes larger due to the higher integration of the semiconductor device whereas the external dimensions of the encapsulated semiconductor device cannot be expanded freely. On the other hand, there is a tendency that the device should further be miniaturized due to the requirements of its higher-density mounting. Nevertheless, the traditional configuration in which a semiconductor chip is mounted on a chip pad presents a problem such that if the dimensions of the semiconductor chip are made larger while the external dimensions of the device remain constant, the length of a portion where the leads are fixed to plastic (the distance of the portion of the inner lead section in which plastic should be filled) becomes insufficient, and the strength required for fixing the leads cannot be provided sufficiently.

Therefore, in order to avoid a problem such as this, there has been proposed a method disclosed in Japanese Patent Laid-Open No. 241959/1986 for bonding a plurality of inner leads adhesively to the circuit formation face of a semiconductor chip with an insulating member included therebetween, and for electrically connecting the inner leads to the semiconductor chip by fine metal wires, with the circumference thereof then being encapsulated with plastic. This configuration is sometimes called lead-on-chip. For a configuration having the same purpose but not using the chip pad, there is a reversed configuration of the lead-on-chip, i.e., a configuration called chip-on-lead. For examples of the chip-on-lead configuration, there have been techniques disclosed in the publications of Japanese Patent Laid-Open No. 154545/1989 and Japanese Patent Laid-Open No. 143344/1989.

Whereas the lead-on-chip is better for a higher integration as compared with the chip-on-lead, there is a need to provide special means for insulating between the circuit formation face of semiconductor chip and each of the leads. Hence, for the typical techniques disclosed in the publication of the Japanese Patent Laid-Open No. 241959/1986, an insulating film is included as an electrically insulating material between the inner leads and the circuit formation face.

For this insulating film, polyimide, etc. are used for its base material. Generally, however, the base materials for insulating film lack adhesiveness to encapsulating plastic.

The insulating film is usually used in a place where it is needed, i.e., the upper face of a semiconductor chip where the inner leads are mounted and not in any other places due to the necessity that the circuit formation face of the semiconductor chip is electrically connected to each of the inner leads, etc.

In a plastic encapsulated semiconductor device, thermal stresses are generated in the inside of the device by the temperature changes taking place during the fabrication processes thereof and the period of its use because the linear expansion coefficients of the semiconductor chip, inner lead, insulating film, and encapsulating plastic, which constitute the device, are usually different from each other. Particularly, the difference in the linear expansion coefficients between the inner lead and the plastic is great. There is also lack of adhesiveness between the inner lead and the plastic, and this easily causes an interfacial debonding for some reasons in a state where thermal stress is exerted.

Fundamentally, if the inner lead is adhesively fixed to the circuit formation face securely through the insulating film, the interfacial debonding should not occur or such occurrence of the debonding could be minimized. As described earlier, however, the adhesion strength between the end face of the insulating film and the encapsulating plastic, which form the base of adhesion, is weak. Therefore, the force which tends to separate the inner lead from the plastic causes the interfacial debonding between the end face of the insulating film and encapsulating plastic. Hence this interfacial debonding is developed to separate the inner lead and encapsulating plastic and allow the interfacial debonding to progress increasingly therebetween.

The interfacial debonding thus developed brings about plastic cracking at the upper edge of the inner lead to spoil the external appearance of the semiconductor device and may also cause the breakage of fine metal wires.

The inner leads, which are particularly susceptible to this danger, are inner leads for electrical connection called common signal (bus bar) leads. The common signal inner leads are used for supplying source, ground or other standard voltages to the semiconductor chip.

SUMMARY OF THE INVENTION

An object of the present invention is to provide a plastic encapsulated semiconductor device and lead frame used therefor capable of mounting a semiconductor chip of the largest possible size within limited external dimensions by preventing the occurrence of plastic cracking from the upper edge of the inner lead for electrical connection.

The above object is achieved by providing means for preventing a debonding occurring at the interface between the end of insulating film and encapsulating plastic from developing into the interface between the common signal inner lead and encapsulating plastic.

As means for preventing such debonding development, the present inventor proposes herein to provide the means given below:

(1) At least a part of the common signal inner lead is separated from the circuit formation face of semiconductor chip and insulating film. Then encapsulating plastic is filled into the spaces thus prepared by such separation.

(2) Surface treatment is given to the opposing faces of common signal inner leads themselves and/or those of insulating films themselves. As surface treatments, a fine irregularity processing (so-called crepe finish treatment) and coating can be applied. For the coating, organic adhesive or certain kind of plating, which contributes to the improvement of bonding capability (adhesiveness) to encapsulation plastic, can be employed.

(3) On a part of the surface of common signal inner lead, one or more than two projections are formed, thereby checking the development of interfacial debonding at the location of this projection.

It is particularly expedient to employ a method such that the common signal inner lead is thinned to provide a space between the insulating member and the common signal inner lead and plastic is included in such portion, or that the common signal inner lead is arranged above the insulting member with a space and plastic is included between the common signal inner lead and insulating member.

A semiconductor device according to another invention of the present application is a plastic encapsulated semiconductor device in which at least at two locations of the circuit formation face of the semiconductor chip with circuit formed thereon, insulating films are bonded, and a common signal inner lead is positioned above each of said insulating films so as to arrange the common signal inner leads themselves to face each other, and signal inner leads are further arranged at positions apart from each of the common signal inner leads, and at least the above elements are encapsulated with plastic, characterized in that inventions (a) to (e) given below are further designed.

(a) Encapsulating plastic is included at least partially between the insulating film and common signal inner lead.

(b) The positions of the respective faces of insulating films opposing to each other and those of common signal inner leads opposing to each other are shifted.

(c) The opposing faces of common signal inner leads themselves present fine irregularities to adhere tightly to encapsulating plastic.

(d) One or more than two projections are formed on the surface of common signal inner lead.

(e) Surface treatment is given to the opposing faces of common signal inner leads, thereby allowing those of the common signal inner leads and encapsulating plastic to be bonded (tightly in adhesion).

In either one of the above cases (a) to (e), the major part of each of the common signal inner leads should desirably be arranged in the longitudinal direction of the semiconductor chip so that the side ends of the major parts themselves become the opposite faces of common signal inner leads themselves. Furthermore, it is desirable to position the group of aforesaid signal inner leads outward the common signal inner leads respectively.

A semiconductor device according to still another invention of the present application is a plastic encapsulated semiconductor device comprising a semiconductor chip with circuit formed thereon, common signal inner leads arranged on the circuit formation face of semiconductor chip through insulating films, a first conductive member electrically connecting the common signal inner leads and the semiconductor chip, a plurality of signal inner leads arranged apart from the common signal inner leads on the circuit formation face of semiconductor chip through insulating films, a second conductive member electrically connecting each of the signal inner leads to the semiconductor chip, and plastic for encapsulating the semiconductor chip, insulating films, the aforesaid inner leads and conductive members, characterized in that the insulating film is bonded to the circuit formation face and encapsulating plastic is filled at least partially between the common signal inner lead and insulating film.

A semiconductor device according to still anther invention of the present application is a plastic encapsulated semiconductor device comprising a semiconductor chip with circuit formed thereon, a plurality of inner lead sections arranged on the circuit formation face of semiconductor chip through an insulating material, conductive members connecting each of the inner lead sections to the semiconductor chip, and plastic for encapsulating at least the above elements, characterized in that the insulating portion in a region immediately beneath the inner lead is at least partially encapsulating plastic.

A semiconductor device according to still another invention of the present application is a plastic encapsulated semiconductor device in which an insulating member is bonded to the circuit formation face of semiconductor chip supported by supporting inner leads, inner leads for electrical connection are arranged above the insulating member, each of the inner leads for electrical connection is electrically connected to the semiconductor chip by fine metal wires, and the circumference thereof is encapsulated with encapsulating plastic, wherein inner leads for electrical connection are provided upward apart from the insulating member and encapsulating plastic is included between the insulating member and inner leads for electrical connection.

Still another semiconductor device is a plastic encapsulated semiconductor device in which an insulating member is bonded to the circuit formation face of semiconductor chip, common signal inner leads and signal inner leads are arranged above the insulating member, and the common signal inner leads and signal inner leads are electrically connected to the semiconductor chip respectively by fine metal wires, and the circumference thereof is encapsulated with encapsulating plastic, characterized in that the signal inner leads are bonded to the insulating member, and the common signal inner leads are further provided upward apart from the insulating member, and the aforesaid encapsulating plastic is included between the insulating member and common signal inner leads.

Still another semiconductor device is a plastic encapsulated semiconductor device comprising a semiconductor chip, an insulating film bonded to the semiconductor chip, two leads for electrical connection arranged with its major portions facing each other on an insulating film, a plurality of inner leads for electrical signaling provided outward the respective leads for electrical connection apart from each of the leads for electrical connection, and the above elements being encapsulated with plastic, characterized in that each of the inner lead is partially thinned so that the opposite face of each lead for electrical connection to the semiconductor chip is made partially recessed, and the aforesaid encapsulated plastic is filled into this recess. In this respect, said tinned portion of the inner lead, which is produced by locally thinning the inner lead, could be embodied to be formed by allowing the inner lead to penetrate in the transverse direction or by locally indenting those opposite faces of inner leads themselves which face the insulating film in this case.

Still another semiconductor device is a plastic encapsulated semiconductor device in which an insulating member is bonded to the circuit formation face of the semiconductor chip, inner leads for electrical connection are arranged above the insulating member, the inner leads for electrical connection are electrically connected to the semiconductor chip respectively by fine metal wires, and the circumference thereof is encapsulated with encapsulating plastic, characterized in that a portion of the inner lead for electrical connection facing the semiconductor chip is thinned by indenting such portion to provide penetration in the transverse direction thereof and encapsulating plastic is included between the insulating member and the inner lead for electrical connection while the portion which is not thinned is bonded to the insulating member. In this case, the thinned portion of the inner leads for electrical connection, which is facing the semiconductor chip should desirably be limited to the portions other than the connecting part being of the fine metal wires.

Still another semiconductor device is a plastic encapsulated semiconductor device in which an insulating member is bonded to the circuit formation face of semiconductor chip, and common signal inner leads and signal inner leads are arranged above the insulating member, and the common signal inner leads and signal inner leads are electrically connected to the semiconductor chip respectively by fine metal wires, and the circumference thereof is encapsulated with encapsulating plastic, characterized in that the signal inner leads are bonded to the insulating member, and further a portion of the face of the common signal inner leads facing the semiconductor chip is thinned by indenting such portion to provide penetration in the transverse direction thereof, and encapsulating plastic is included between the insulating member and common signal inner leads, and the portion which is not thinned is bonded to the insulating member. In this case, the thinned portion of common signal inner leads, which is facing the semiconductor chip should desirably be limited to the portion other than the connecting part being of fine metal wires.

Still another semiconductor device is a plastic encapsulated semiconductor device comprising a semiconductor chip, an insulating film bonded to the circuit formation face of semiconductor chip, inner leads for electrical connection with the major portion being positioned above the insulating film, and these elements being encapsulated with plastic, characterized in that the cracking control means selected from 1 on the surface of inner lead for electrical connection, one or more than two projections are formed, 2 the surface is made rough by fine irregularities, and 3 adhesive application.

Still another semiconductor device is a plastic encapsulated semiconductor device in which an insulating member in bonded to the circuit formation face of semiconductor chip, inner leads for electrical connection are arranged above the insulating member, the inner leads for electrical connection and semiconductor chip are electrically connected respectively by fine metal wires, and the circumference thereof is encapsulated with encapsulating plastic, characterized in that a portion of the inner leads for electrical connection facing the semiconductor chip is indented to provide penetration in the transverse direction thereof, and encapsulating plastic is included between the insulation member and the inner leads for electrical connection. In this respect, it is desirable that in addition to this device, the portion of inner leads for electrical connection, which is not indented is bonded to the insulating member, and that encapsulating plastic is included between the portion of the inner leads for electrical connection facing the semiconductor chip and the insulating member.

As means for preventing the development of debonding, the present inventor hereof proposes means to cover the opposing faces of common signal inner leads themselves with film having a good adhesiveness to encapsulating plastic.

Also, as means for reducing stress occurring at the upper edge of common signal inner leads, the present inventor hereof proposes means for thinning the common signal inner leads to bond them to the insulating film.

A semiconductor device according to the present invention is a plastic encapsulated semiconductor device in which an insulating member is bonded to the circuit formation face of semiconductor chip, common signal inner leads and signal inner leads are arranged above the insulation member, the common signal inner leads and signal inner leads are electrically connected to the semiconductor chip respectively by fine metal wires, and the circumference thereof is encapsulated with encapsulating plastic, characterized in that the sides of common signal inner leads are covered with film having a good adhesiveness to encapsulating plastic.

Still another semiconductor device is a plastic encapsulated semiconductor device in which an insulating member is bonded to the circuit formation face of semiconductor chip, common signal inner leads and signal inner leads are arranged above the insulation member, the common signal inner leads and signal inner leads are electrically connected to the semiconductor chip respectively by fine metal wires, and the circumference thereof is encapsulated with encapsulating plastic, characterized in that thinned portions are provided to the common signal inner leads to bond these inner leads to the insulating member.

Still another semiconductor device is a plastic encapsulated semiconductor device in which an insulating member is bonded to the circuit formation face of semiconductor chip, common signal inner leads and signal inner leads are arranged above the insulation member, the common signal inner leads and signal inner leads are electrically connected to the semiconductor chip respectively by fine metal wires, and the circumference thereof is encapsulated with encapsulating plastic, characterized in that thinned portions are provided both to the common signal inner leads and signal inner leads.

Still another invention hereof is a plastic encapsulated semiconductor device in which common signal inner leads and a plurality of signal inner leads are bonded with adhesives to the circuit formation face of semiconductor chip through an insulating member included for electrically insulating between them, the common signal inner leads and signal inner leads are electrically connected to the semiconductor chip respectively by fine metal wires, and the circumference thereof is encapsulated with encapsulating plastic to form a encapsulated body, wherein plastic is included in regions immediately beneath the common signal inner leads to be in contact at least partially with both of the circuit formation face of semiconductor chip and the common signal inner leads.

The semiconductor devices set forth above are best suited for use as four- or sixteen-megabit dynamic random access memory.

The features of semiconductor devices according to the present invention have been described as above. For these semiconductor, however, the employment of lead frames given below is essential.

In other words, the structure of a typical lead frame is such that the major portions of inner side of leads for electrical connection (common signal) are arranged to face each other almost in parallel, and a plurality of electric signal leads are respectively arranged outward thereof (if required, inner leads for semiconductor chip support can be employed or dummy inner leads may be included), and adhesive is applied to, fine irregularity process is performed on, projections are formed on or partial thinnings are provided to the portions where the inner leads for electrical connection (common signal) face each other.

The other lead frame according to the present invention is a lead frame having an aggregate of leads each comprising inner leads for electrical connection in a plastic encapsulated body and outer leads outside the plastic encapsulated body, characterized in that at least a portion of the inner lead for electrical connection arranged above an insulating member bonded to the circuit formation face of a semiconductor chip is thinned by indenting a portion of its face opposite to the semiconductor chip to provide penetration in the transverse direction thereof. In this case, the thinned portion of inner leads for electrical connection which is facing the semiconductor chip should desirably be limited to the portion other than the connecting part being of the fine metal wires.

Still another lead frame is a lead frame having an aggregate of leads each comprising common signal inner leads and signal inner leads in a plastic encapsulated body and outer leads outside the plastic encapsulated body, characterized in that at least a portion of the common signal inner leads arranged above an insulating member bonded to the circuit formation face of a semiconductor chip is thinned by indenting the portion of its faces opposite to the semiconductor chip to provide penetration in the transverse direction thereof. In this case, the thinned portion of the common signal lead should desirably be limited to the portion which is other than the connecting part of fine metal wires and faces the semiconductor chip.

Still another lead frame is a lead frame having an aggregate of leads each comprising inner leads for electrical connection and inner lead for supporting a semiconductor chip in a plastic encapsulated body, and outer leads outside the plastic encapsulated body, characterized in that at least proportions of the inner leads for electrical connection arranged above an insulating member bonded to the circuit formation face of the semiconductor chip are provided upward apart from the insulating member.

Still another lead frame is a lead frame having an aggregate of leads each comprising common signal inner leads and signal inner leads in a plastic encapsulated body and outer leads outside the plastic encapsulated body, characterized in that at least proportions of common signal inner leads arranged above an insulating member bonded to the circuit formation face of a semiconductor chip are provided upward apart from the insulating member.

Still another lead frame is a lead frame having an aggregate of leads each comprising inner leads for electrical connecting in a plastic encapsulated body and outer leads outside the plastic encapsulated body, characterized in that a part of the portions of inner leads for electrical connection arranged at least on the insulating member bonded to the circuit formation face of a semiconductor chip, facing the semiconductor chip, is indented to provide penetration in the transverse direction thereof.

Still another lead frame is a lead frame having an aggregate of leads each comprising common signal inner leads or signal inner leads in a plastic encapsulated body and outer leads outside the plastic encapsulated body, characterized in that the sides of common signal inner leads are covered with film having a good adhesiveness to encapsulating plastic.

Still another lead frame is a lead frame having an aggregate of leads each comprising common signal inner leads and signal inner leads in a plastic encapsulated body and outer leads outside the plastic encapsulated body, characterized in that thinned portions are provided to the common signal inner leads.

Still another lead frame is a lead frame having an aggregate of leads each comprising common signal inner leads and signal inner leads in a plastic encapsulated body and outer leads outside the plastic encapsulated body, characterized in that thinned portions are provided both to the common signal inner leads and signal inner leads.

In the lead frames set forth above, an insulating film can be laid on the one side of the inner leads through adhesives, which may be used as so-called intermediate product.

In this respect, the term insulating material or insulating member in the above descriptions means the term insulating film or inclusion comprising insulating film and encapsulating plastic in each of the embodiments as the case may be.

With the inventions mentioned above, if an interfacial debonding should occur between the insulating film and encapsulating plastic, (1) the interfacial debonding can be checked by encapsulating plastic before it develops into the interface between the common signal (electrical connection) inner lead and encapsulating plastic, (2) the interfacial debonding is checked by the bonding strength (adhesive strength) between the common signal (electrical connection) inner leads and encapsulating plastic, (3) the development of the interfacial debonding is checked by a projection provided to a part of inner leads even when the debonding has progressed to reach the inner lead interface, or (4) the debonding development is checked before it reaches the inner lead interface by the bending point provided in the possible debonding path starting at the interface between the insulating film and encapsulating plastic, which functions to prevent the straight propagation thereof.

Particularly by including encapsulating plastic between the common signal inner leads and insulating member, the common signal inner leads and insulating member are set apart with plastic. Thus the interfacial debonding occurring in the circumference of common signal inner leads and that in the side of insulating member are isolated from each other, so that the deformation of plastic at the upper edge of common signal inner leads is not increased. Hence there is no great stress to occur at the upper edge of common signal inner leads and the plastic cracking occurring from this portion can be prevented, making it possible to obtain a highly reliable plastic encapsulated semiconductor device even when a semiconductor chip of a large size is mounted therein.

By covering the opposing faces of common signal inner leads themselves with film having a good adhesiveness to encapsulating plastic, any interfacial debonding between the end of insulating film and encapsulating plastic does not progress to common signal inner leads-to-encapsulating plastic interfaces because of the bonding strength (adhesiveness) between the common signal inner leads and encapsulating plastic.

Even if an interfacial debonding should occur between the common signal inner leads and encapsulating plastic, the deformation of plastic above the common signal inner leads is reduced by thinning the common signal inner leads and the stress generated at the upper edge of the common signal inner leads is lowered.

By including the encapsulating plastic in the portions immediately beneath the common signal inner leads, it is possible to prevent by plastic the interfacial debonding that has occurred at the sides of the common signal inner leads to develop into the side of the insulating member. Thus it is possible to prevent plastic from contracting towards the center of the semiconductor chip when the semiconductor device is cooled.

According to the present invention, there is no great stress to occur due to the cooling required subsequent to the plastic encapsulation thereof or the temperature drop at the time of a temperature cycling test. As a result, it is possible to prevent the occurrence of plastic cracking and further to obtain a plastic encapsulated semiconductor device capable of mounting a semiconductor chip of the largest possible size within the limited external dimensions thereof.

DESCRIPTION OF THE PREFERRED EMBODIMENTS

Hereinafter the present invention will be described in conjunction with the accompanying drawings.

(First Embodiment)

Figure 1:
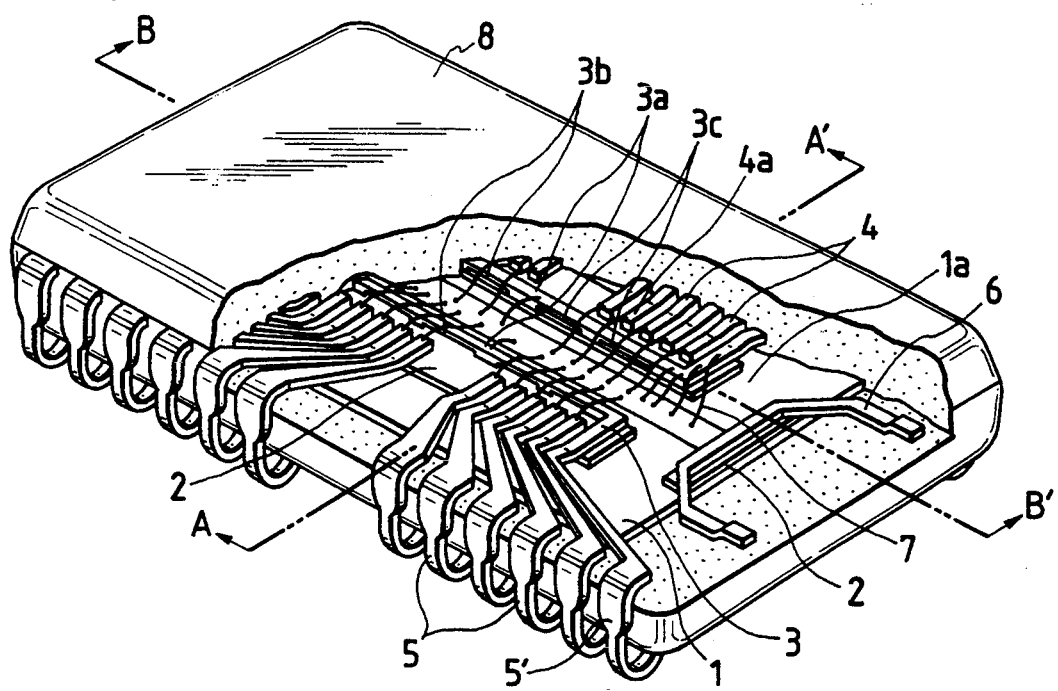
FIG. 1 is a partially sectional perspective view showing a first embodiment of a plastic encapsulated semiconductor device according to the present invention.
Figure 2:
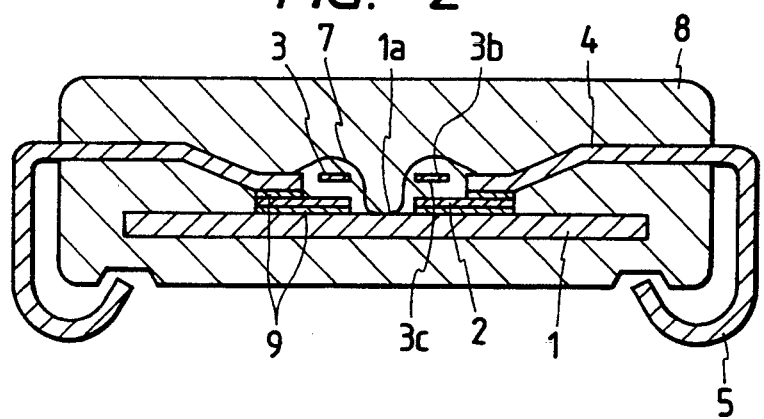
FIG. 2 is a cross-sectional view taken along the line A—A' of FIG. 1.
Figure 3:
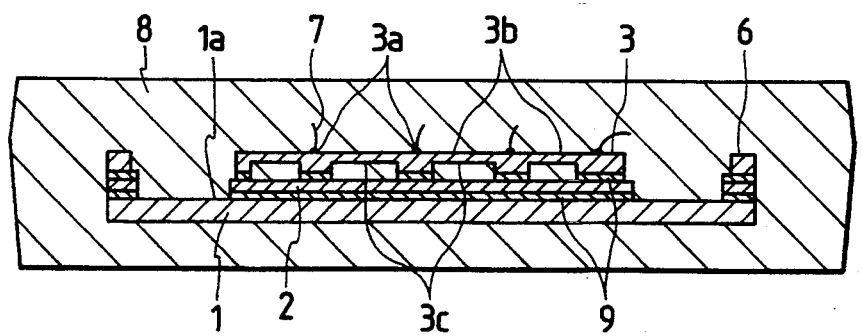
FIG. 3 is a cross-sectional view taken along the line B—B' of FIG. 1.

With reference to FIG. 1, FIG. 2, and FIG. 3, a first embodiment of the present invention is described. FIG. 1 is a partially sectional perspective view showing an embodiment of a plastic encapsulated semiconductor device according to the present invention; FIG. 2 is a cross-sectional view taken along the line A—A' of FIG. 1; and FIG. 3 is a cross-sectional view taken along the line B—B' of FIG. 1.

In the figures, a common signal inner lead 3 and signal inner lead 4 are integrally formed with outer leads 5 and 5' at one end sides thereof. The outer leads 5 are arranged in the two direction (longitudinal face) of the plastic encapsulated semiconductor device.

The common signal inner lead 3 is extended in the central part of semiconductor chip 1 in parallel with the longer side thereof, and is electrically connected to the semiconductor chip 1 by fine metal wires 7 on the circuit formation face 1a of semiconductor chip 1. The circuit formation face 1a is mostly covered by passivation film such as PIQ (Polyimide Isoindolo Quinazolindione), etc. However, this region of electric connection is not covered by the passivation film, and the circuit formation face 1a therein is exposed. Also, the signal inner lead 4 is extended toward the central part of the semiconductor chip 1 across each long side of the oblong semiconductor chip 1, and the leading end thereof is electrically connected to the semiconductor chip 1 by fine metal wire 7 on the circuit formation face 1a of the semiconductor chip 1. Thus, the major portions of two common signal inner leads 3 are positioned to face each other.

There is provided a sheet insulating member 2 between the lower faces of common signal inner lead 3 and signal inner lead 4 and the circuit formation face 1a of semiconductor chip 1 to electrically insulate the common signal inner lead 3 and signal inner lead 4 from the semiconductor chip 1. The insulating member 2 is bonded to the semiconductor chip 1 with adhesive 9. The side ends of common signal inner lead 3 and insulating member 2 do not protrude beyond each other; the ends are so-called flush with each other. In this respect, each end of the insulating member 2 and common signal inner lead 3 (opposing faces) of the present embodiment is directly in contact with encapsulating plastic 8 without adhesive.

The portion 3b of common signal inner lead 3 where no fine metal wire is connected is made thinner than the portion 3a where the fine metal wire is connected, by indenting its face opposite to the semiconductor chip 1 to provide penetration in the transverse direction thereof. Plastic 8 is provided between the insulating member 2 and the portion 3b having the thinner portion 3c of the common signal inner lead 3 where no fine metal wire is connected. The common signal inner lead 3 is bonded to the insulating member 2 by adhesive 9 in the place where no thinner portion 3c is provided. Further, the signal inner lead 4 is bonded to the insulating member 2 with adhesive 9.

In the present embodiment, a semiconductor device is configurated by encapsulating with plastic 8 a semiconductor chip 1, insulating member 2, common signal inner lead 3, signal inner lead 4, and fine metal wire 7. A numeral 4a denotes the connecting part of the fine metal wire.

According to the present embodiment, it is possible to provide plastic 8 between signal inner lead 3 and insulating member 2 by thinning the portion 3b of the common signal inner lead 3 where no fine metal wire is connected, so that the interfacial debonding from plastic 8 is limited at least to the interface between the common signal inner lead 3 and plastic 8. Thus, the deformation of plastic 8 in the upper part of common signal inner lead 3, which occurs by cooling a semiconductor device after plastic encapsulation or by lowering temperature at the time of temperature cycling test, is reduced so as not to generate any great stress at the upper edge of common signal inner lead 3, thereby preventing the occurrence of plastic cracking at this portion.

As shown in FIG. 2 and FIG. 3, the bonding of the circuit formation face 1a of semiconductor chip 1 and the insulating member 2, and the bondings of the insulating member 2 and the common signal inner lead 3, the insulating member 2 and signal inner lead 4, and the insulating member 2 and supporting inner lead 6 are made by adhesive 9. In this respect, while the bonding of the common signal inner lead 3 and insulating member 2 is performed in the portion other than the thinned portion 3c, the bonding may be performed on either the entire or part of these portions. Also, there may be no problem even if the common signal inner lead 3 and the insulating member 2 are not bonded.

The bonding area between the insulating member 2 and the semiconductor chip 1, the common signal inner lead 3, or the signal inner lead 4 should desirably be minimized to such an extent that the bonding of fine metal wire 7 to the common signal inner lead 3 is stably and reliably made and the area can withstand the external forces exerted from the connections by the fine metal wires 7 and the encapsulation processing with plastic 8.

Subsequently a method of bonding the common signal inner lead 3, signal inner lead 4 and supporting inner lead 6 to the circuit formation face 1a of semiconductor chip 1 using adhesive 9 with the insulating member 2 induced will be described. On each of the places of the circuit formation face 1a of semiconductor chip 1 facing the common signal inner lead 3, signal inner lead 4, and supporting inner lead 6 respectively, divided sheet insulating members 2 are affixed by adhesive 9. Then the common signal inner lead 3, signal inner lead 4, and supporting inner lead 6 are fixedly bonded by adhesive 9 to the circuit formation face 1a of semiconductor chip 1 through the insulating member 2. In the embodiments hereinafter, the insulating member is used not separately but commonly for both the common signal inner lead and the signal inner lead. However, the insulating member is separately provided for the supporting inner lead. In the representative embodiments, the insulating member is divided into four, but may be divided into five or more.

For the insulating member 2, a material composed of epoxy resin, bismaleimidetriazine resin, phenolic resin, polyimide resin, etc. as its major components, is used with inorganic filler and various additives being added as required, and for the adhesive 9, a material such as epoxy, polyether amide, polyimide precursor, epoxy modified polyimide, etc. is used.

While the common signal inner lead 3, signal inner lead 4, and supporting inner lead 6 are connected with each other until encapsulated by plastic 8 to form a series of lead frames, these are cut and separated, and then formed. When the semiconductor chip 1 can be fixed sufficiently securely by the common signal inner lead 3 and/or the signal inner lead 4, the supporting inner lead 6 may be omitted. The lead frame is made of, for example, Fe-Ni alloy (Fe-42Ni, etc.), Cu and others.

For the fine metal wire 7, a fine wire made of aluminum (Al), gold (Au), copper (Cu), or the like is employed.

For the encapsulating plastic 8, epoxy resins with phenol hardening agent, silicone rubber, and inorganic filler are used.

The direction in which the outer lead 5 is drawn to the outside of plastic 8 is not limited to the two directions as shown in FIG. 1, i.e., the longer sides of the plastic encapsulated semiconductor device, but may be to one direction only or to three or more directions. Also, the outer lead 5 can be drawn not only from the side end of the plastic 8 but either from the upper end or bottom end of the plastic 8. In the figures, the outer lead 5 is bent down, and the leading end thereof is further bent downward to the bottom face of the plastic 8, which represents an example J type bend. The outer lead 5, however, can be bent down in an arbitrary direction and shape or it can be arranged without any bend.

(Second Embodiment)

Figure 4:
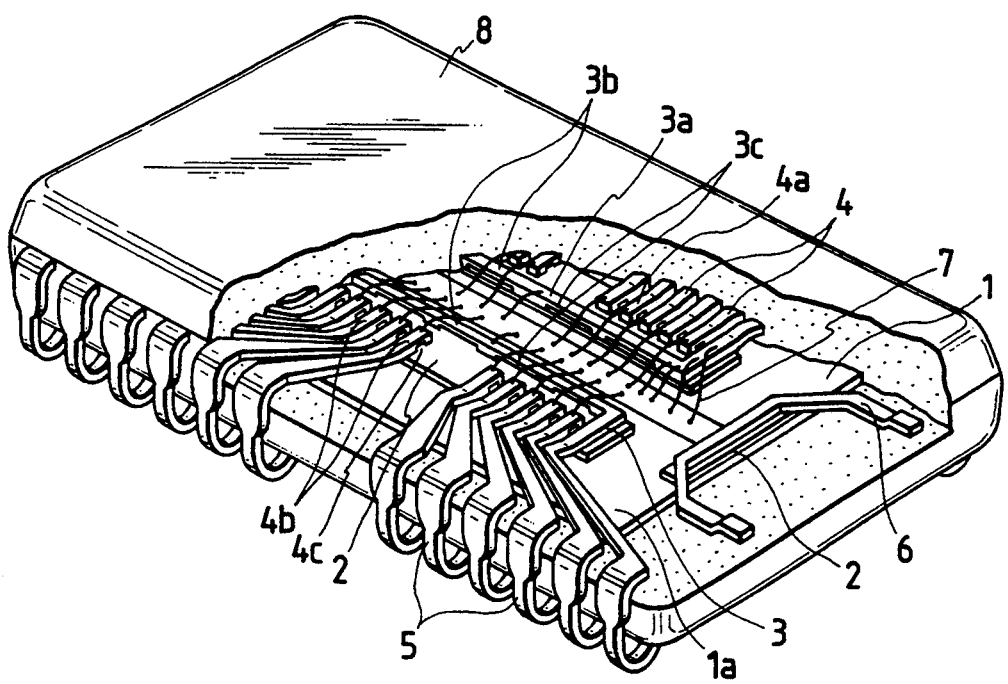
FIG. 4 is a partially sectional perspective view showing a second embodiment of a plastic encapsulated semiconductor device according to the present invention.

While in the first embodiment the thinned portion 3c is provided in the portion 3b of common signal inner lead 3 where no fine metal wire is connected, the portion 4b of signal lead 4 facing the semiconductor chip 1, where no fine metal wire is connected, is depressed to provide penetration through in the transverse direction thereof to provide a thinned portion 4c as shown in FIG. 4. Then it is also possible to include plastic 8 between the signal inner lead 4 and insulating member 2.

(Third Embodiment)

Figure 5:
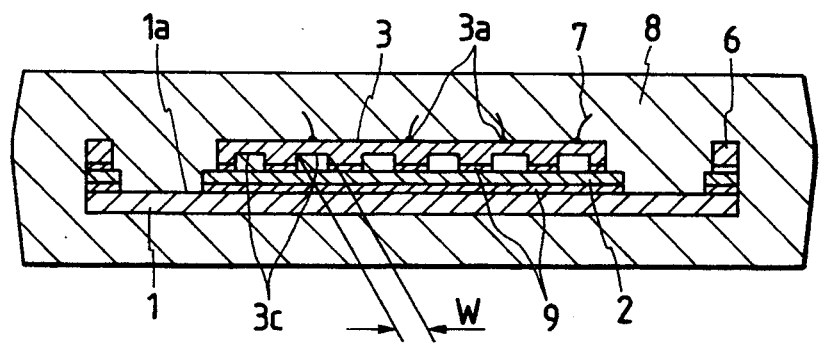
FIG. 5 is a partially sectional perspective view taken in the direction of the shorter side of a third embodiment of a plastic encapsulated semiconductor device according to the present invention.

As shown in FIG. 5, the length W of the thinned portion 3c of common signal inner lead 3 is made minimum for plastic 8 to be filled and included between the common signal inner lead 3 and insulating member 2. A plurality of these portions are arranged at short intervals. Thus the thinned portion 3c of common signal inner lead 3 can be provided without distinction between the parts where the fine metal wire 7 is connected and not connected.

While in the above embodiments from the first through the third, the common signal inner lead 3 and signal inner lead 4 are separately indicated, it is to be understood that the present invention is applicable, without departing from the scope thereof, to a semiconductor device in which the common signal inner lead 3 and signal inner lead 4 are not separated or to a semiconductor device in which no common signal inner lead 3 is provided.

(Fourth Embodiment)

Figure 6:
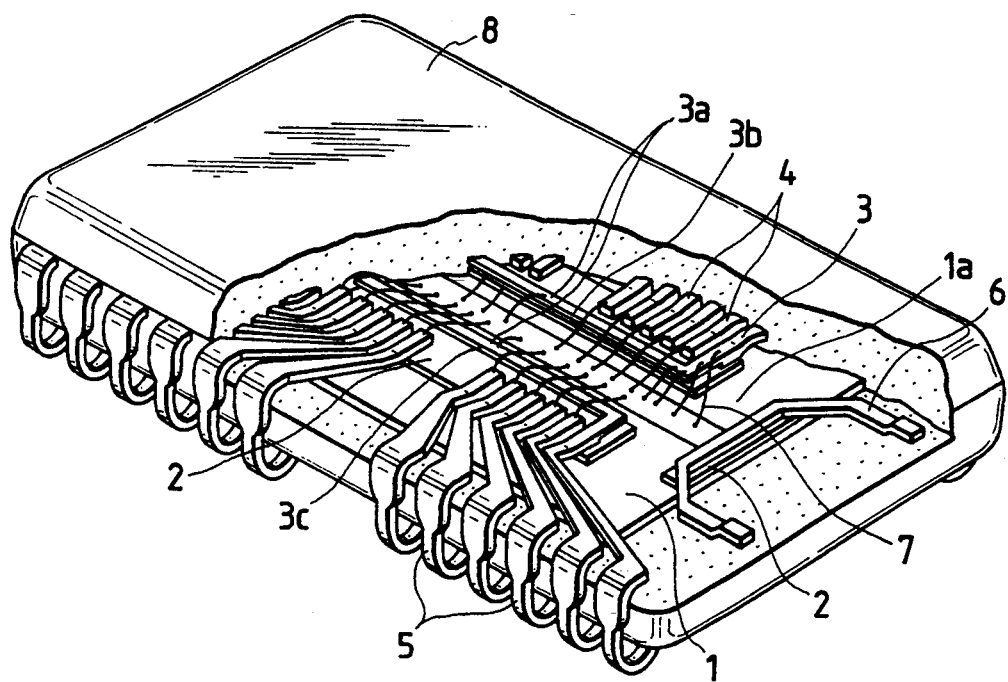
FIG. 6 is a partially sectional perspective view showing a fourth embodiment of a plastic encapsulated semiconductor device according to the present invention.

FIG. 6 is a partially sectional perspective view showing a fourth embodiment of a plastic encapsulated semiconductor device according to the present invention. In the figure, an evenly thinned portion 3c is provided on the common signal inner lead 3 positioned above the insulating member 2 facing the semiconductor chip 1 in such a manner that the portion is depressed to provide penetration in the transverse direction without distinction of the connecting part 3a from non-connecting part 3b of fine metal wires.

Between the thinned portion 3c of common signal inner lead 3 and the insulating member 2, plastic 8 is included. The bonding of the common signal inner lead 3 to the insulating member 2 is performed with adhesive 9 in a location near the outer lead 5 of the common signal inner lead 3 in the present embodiment, but the common signal inner lead 3 and the insulating member 2 are not necessarily bonded by adhesive.

The bonding of fine metal wire 7 to the common signal inner lead 3 is performed by pressing the common signal inner lead 3 onto the insulating member 2 to be in contact therewith to stabilize the common signal inner lead 3 only in the case of bonding being made. After the fine metal wire 7 has been connected, there is provided a space between the thinned portion 3c of the common signal inner lead 3 and the insulating member 2 for plastic 8 to be filled thereinto.

The semiconductor chip 1 is fixed by bonding the signal inner lead 4 to the circuit formation face 1a of semiconductor chip 1 through the insulating member 2.

According to the present embodiment, plastic 8 can also be included between the common signal inner lead 3 and the insulating member 2. Thus it is possible to limit the portion of interfacial debonding from plastic 8 at least to the circumference of the common signal inner lead 3 only. Accordingly the deformation of plastic 8 above the common signal inner lead 3 can be reduced and no great stress is generated at the upper edge of common signal inner lead 3. As a result, plastic cracking from this portion can be prevented.

(Fifth Embodiment)

Figure 7:
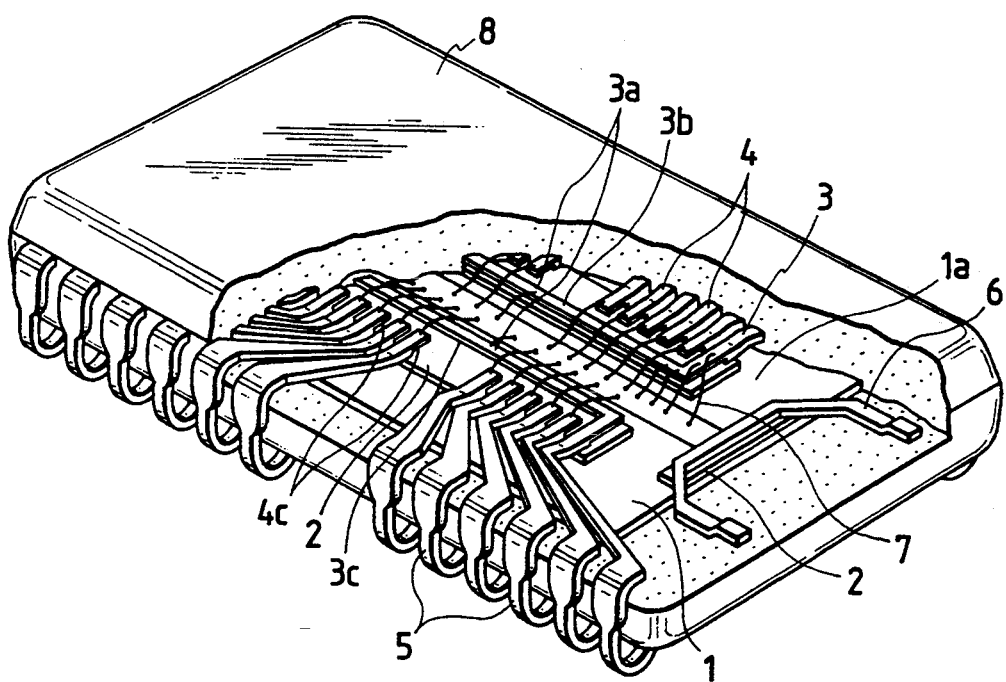
FIG. 7 is a partially sectional perspective view showing a fifth embodiment of a plastic encapsulated semiconductor device according to the present invention.

In the fourth embodiment, an example has been shown to provide the thinned portion 3c to the common signal inner lead 3 only. As shown in FIG. 7, however, it is also possible to provide in a semiconductor device a similar thinned portion 4c on the face of the signal inner lead 4 positioned above the insulating member 2 opposite to the semiconductor chip 1, which is evenly depressed to provide penetration in the transverse direction thereof, in order to include plastic between the signal inner lead 4 and the insulating member 2. At the time of bonding the signal inner lead 4 and the fine metal wire 7, the signal inner lead 4 above the insulating member 2 is pressed to be in contact with the insulating member 2, but after the connection has been completed, a space between these two members is formed for plastic 8 to be included. In this case, the semiconductor chip 1 is fixed by the supporting inner lead 6.

(Sixth Embodiment)

Figure 8:
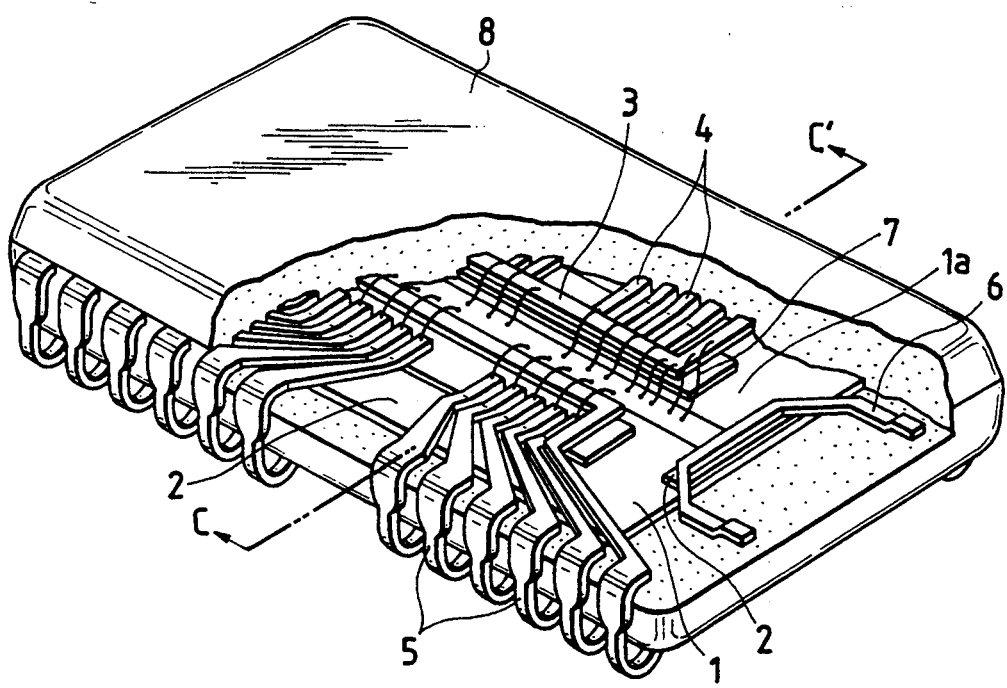
FIG. 8 is a partially sectional perspective view showing a sixth embodiment of a plastic encapsulated semiconductor device according to the present invention.
Figure 9:
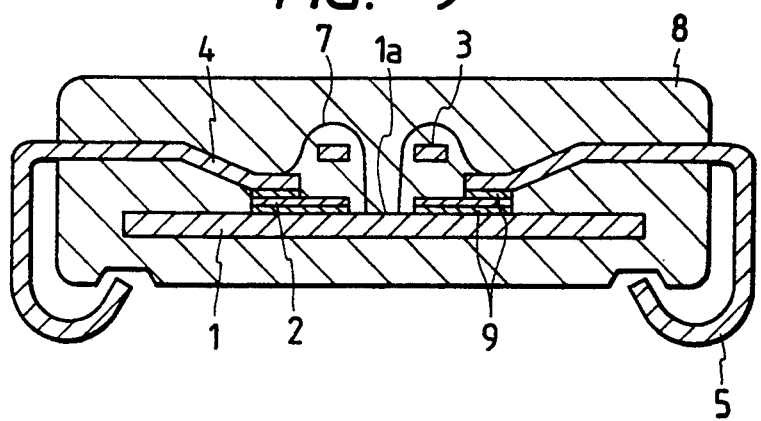
FIG. 9 is a cross-sectional view taken along the line C—C' of FIG. 8.

FIG. 8 and FIG. 9 illustrate still another embodiment of the present invention. FIG. 8 is a partially sectional perspective view showing a sixth embodiment according to the present invention while FIG. 9 is a cross-sectional view taken along the line C—C' of FIG. 8.

Above the insulating member 2, the common signal inner lead 3 is positioned above the signal inner lead 4 and further the common signal inner lead 3 is arranged apart form the insulating member 2 with plastic 8 included between the common signal inner lead 3 and the insulating member 2. The signal inner lead 4 is bent down and is bonded to the insulating member 2 with adhesive 9. The common signal inner lead 3 is not bent down and is not bonded to the insulating member 2, either. The bonding of fine metal wire 7 to the common signal inner lead 3 is made by pressing the common signal inner lead 3 onto the insulating member 2 to be in contact therewith to stabilize the common signal inner lead 3 only when the bonding is made. The common signal inner lead 3 is arranged at a position upward apart from the insulating member 2, so that plastic 8 can be filled between the common signal inner lead 3 and the insulating member 2 during the plastic encapsulation process after the fine metal line 7 has been connected.

The semiconductor chip 1 is fixed by the signal inner lead 4 and/or the supporting inner lead 6.

According to the present embodiment, plastic 8 can be included between the common signal inner lead 3 and the insulating member 2 by arranging the common signal inner lead 3 upward apart from the insulating member 2. Thus it is possible to limit the portion of interfacial debonding from plastic 8 at least to the circumference of the common signal inner lead 3 only. Accordingly the deformation of plastic 8 above the common signal inner lead 3 caused by the cooling after plastic encapsulation of the semiconductor device or by the temperature drop at the time of temperature cycling test can be reduced and no great stress is generated at the upper edge of the common signal inner lead 3. As a result, the occurrence of plastic cracking from this portion can be prevented.

In the present embodiment, since the signal inner lead 4 is bent down, the common signal inner lead 3 is not bent down. The common signal inner lead 3 is positioned apart from the insulating member 2 by arranging the former at the same height as the outer lead 5 is drawn to the outside of the semiconductor device. However, in a semiconductor device such that the signal inner lead 4 is not bent down, the common signal inner lead 3 may be bent up to position the same apart from the insulating member 2.

(Seventh Embodiment)

Figure 10:
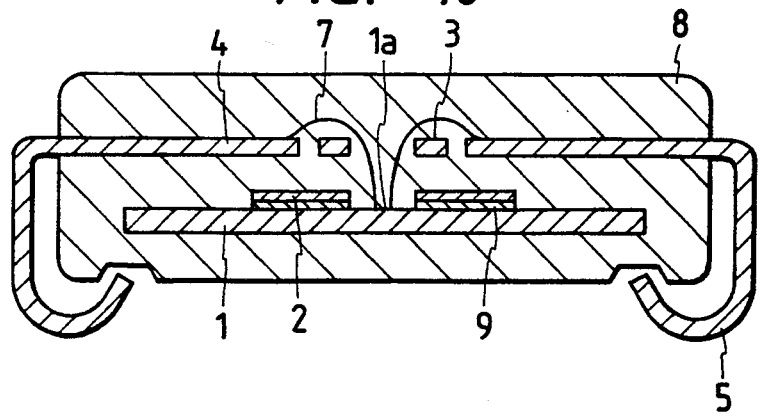
FIG. 10 is a cross-sectional view showing a seventh embodiment of a plastic encapsulated semiconductor device according to the present invention.

In the sixth embodiment, an example shows that the common signal inner lead 3 is arranged upward apart from the insulating member 2 to include plastic 8 between the common signal inner lead 3 and the insulating member 2. As shown in FIG. 10, however, it is also possible to provide in a semiconductor device the signal inner lead 4 arranged together with the common signal inner lead 3 apart from the insulating member 2 to allow both common signal inner lead 3 and signal inner lead 4 to include plastic 8 between the insulating member 2 and both of them. In this case, the semiconductor chip 1 is fixed by the supporting inner lead 6 arranged at the shorter side of the semiconductor chip 1.

(Eighth Embodiment)

Figure 11:
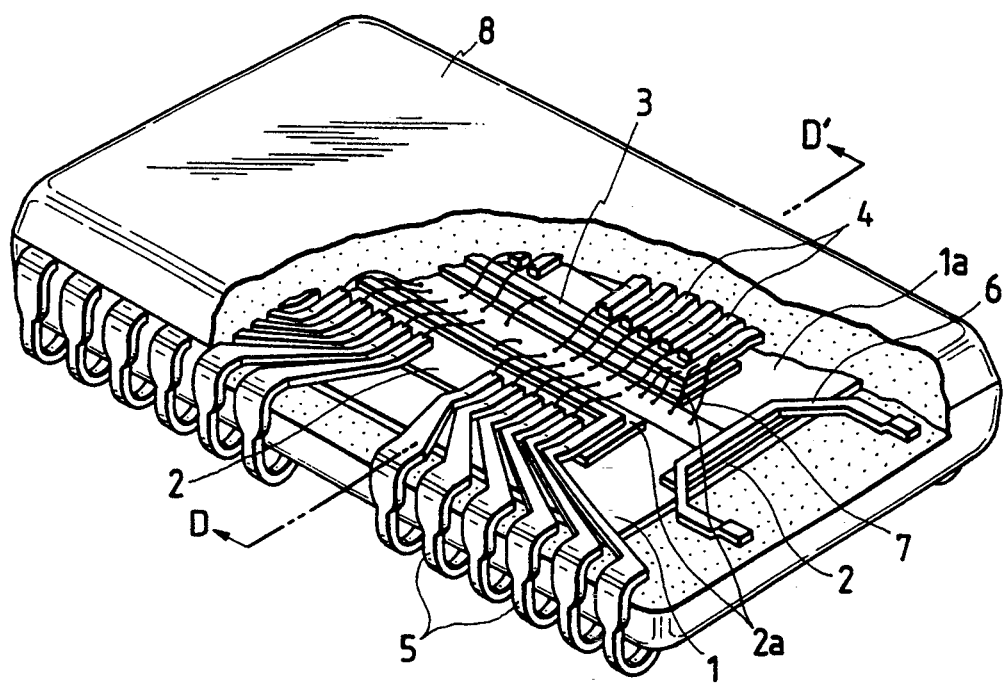
FIG. 11 is a partially sectional perspective view showing a eighth embodiment of a plastic encapsulated semiconductor device according to the present invention.
Figure 12:
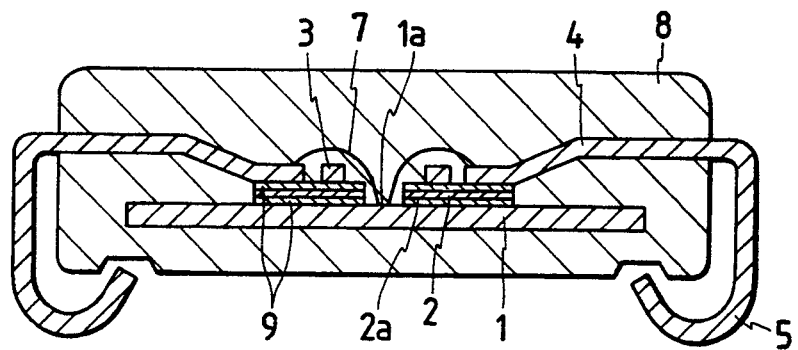
FIG. 12 is a cross-sectional view taken along the line D—D' of FIG. 11.

FIG. 11 and FIG. 12 illustrate an eighth embodiment of the present invention. FIG. 12 is a cross-sectional view taken along the line D—D' of FIG. 11. The present embodiment differs from those hitherto described in that an extended portion 2a is formed by allowing the insulating member 2 to protrude beyond the side of the major portion of common signal inner lead 3. Thus, if an interfacial debonding from plastic 8 should occur at the end of the insulating member 2, the interfacial debonding does not propagate straight because the end of insulating member 2 and the side of the major portion of common signal inner lead 3 are not flush with each other, and the debonding force is dissipated and reduced.

(Ninth, Tenth, Eleventh, and Twelfth Embodiments)

Figure 13:
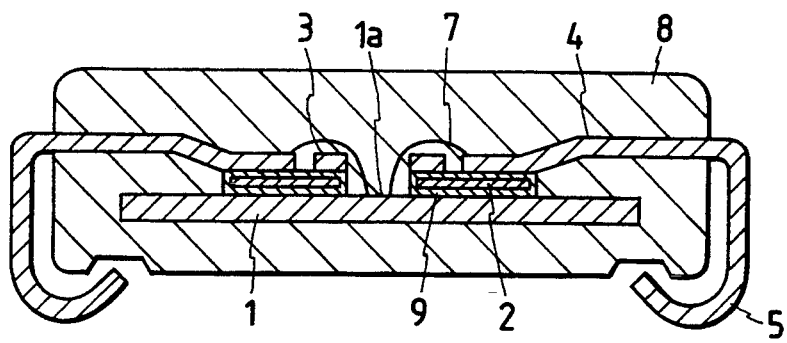
FIG. 13 is a cross-sectional view showing a ninth embodiment of a plastic encapsulated semiconductor device according to the present invention.
Figure 14:
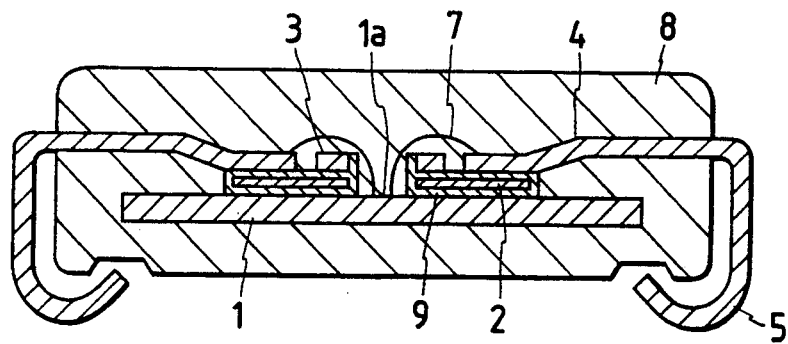
FIG. 14 is a cross-sectional view showing a tenth embodiment of a plastic encapsulated semiconductor device according to the present invention.

FIG. 13 shows a ninth embodiment according to the present invention. The present embodiment differs from each of those hitherto described in that adhesive is applied even to the side of the insulating member 2. In this respect, there is no problem even when the adhesive applied to the side is expanded, so that the side of the common signal inner lead 3 is also covered. An example of this case (tenth embodiment) is shown in FIG. 14. In either example, a plating layer having a good adhesiveness to plastic 8 may also applicable on each side of the insulating member 2 and/or common signal inner lead 3 in place of the adhesive.

Figure 15:
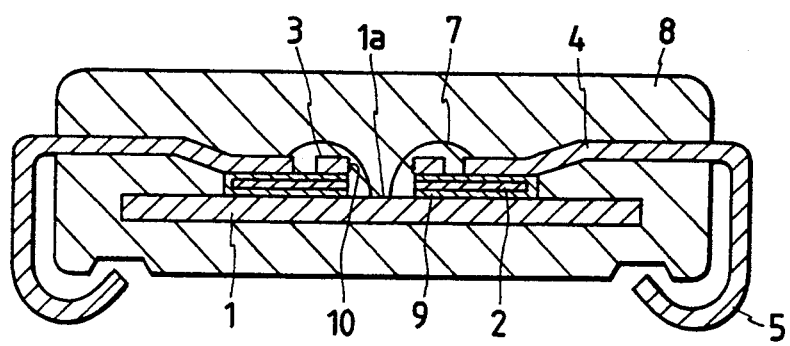
FIG. 15 is a cross-sectional view showing a eleventh embodiment of a plastic encapsulated semiconductor device according to the present invention.

Further, instead of adhesive, etc., a roughing (fine irregularities, crepe surface) may be performed on each side of the insulating member 2 and/or common signal inner lead 3 (refer to FIG. 15 (eleventh embodiment)). A numeral 10 denotes the portion where the roughing is performed. According to these embodiments, interfacial debonding between plastic 8 and the end of insulating member 2 and/or between plastic 8 and the side of common signal inner lead 3 seldom occurs or the interfacial debonding can hardly propagate even if it should occur.

Figure 16:
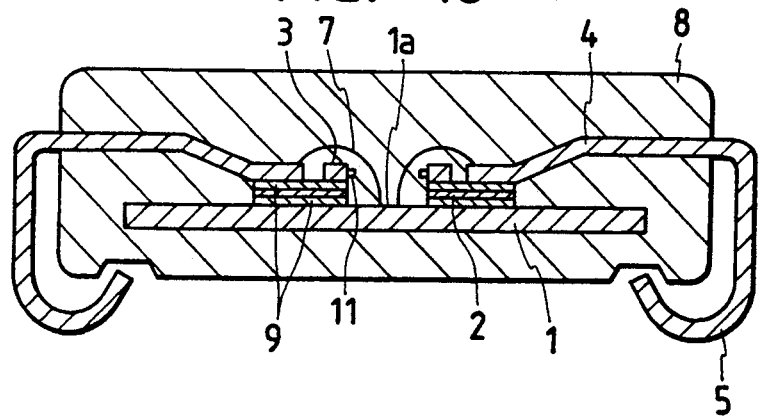
FIG. 16 is a cross-sectional view showing a twelfth embodiment of a plastic encapsulated semiconductor device according to the present invention.

Also, as shown in FIG. 16 (twelfth embodiment), if one or more projections 11 are formed on the surface of the common signal inner lead 3, the development of interfacial debonding is checked by the projection 11 even when the interfacial debonding should by any chance reach the root of the projection 11.

(Comparative Description of Prior Art)

Figure 17:
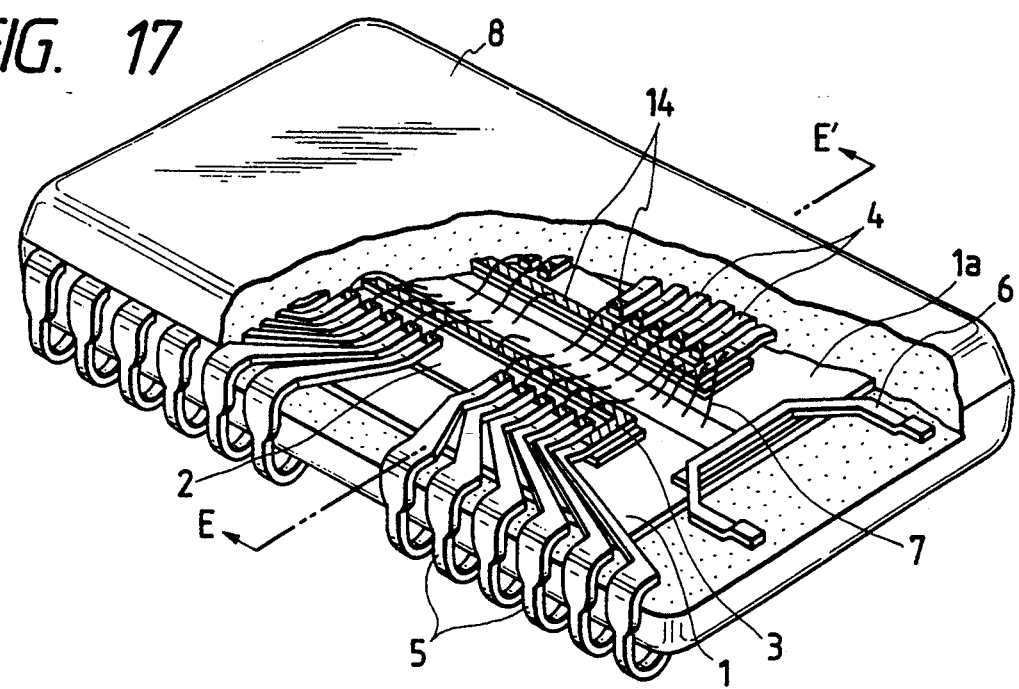
FIG. 17 is a partially sectional perspective view showing an example of a conventional lead-on-chip type plastic encapsulated semiconductor device.
Figure 18:
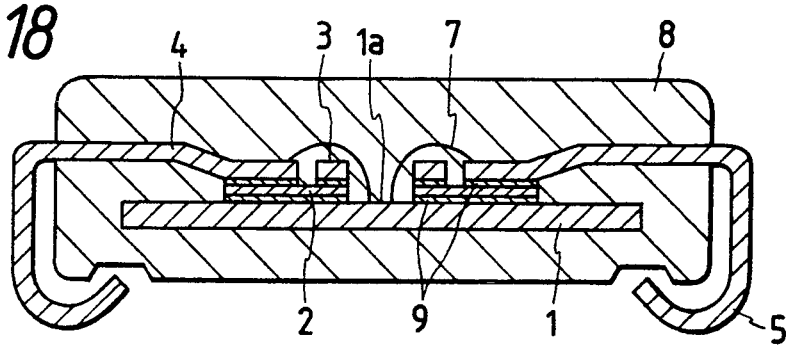
FIG. 18 is a cross-sectional view taken along the line E—E' of FIG. 17.

FIG. 17 is a partially sectional perspective view showing an example of a conventional lead-on-chip type plastic encapsulated semiconductor device which is taken as an object of the present invention, and FIG. 18 is a cross-sectional view taken along the line E—E' of FIG. 17.

On the circuit formation face 1a of semiconductor chip 1 supported (fixedly bonded) by the supporting inner lead 6, the common signal inner lead (also called bus bar inner lead) 3 and signal inner lead 4 are bonded by adhesive 9 to the semiconductor chip 1 through an insulating member 2 for electrical insulation therebetween, and the common signal inner lead 3 and signal inner lead 4 are connected to the semiconductor chip 1 respectively by fine metal wires 7. Then these elements are encapsulated with plastic 8 to form a package.

For the parts of the common signal inner lead 3 and signal inner lead 4 where the fine metal wires are connected, precious metal films of gold (Au) or silver (Ag), etc. are applied to improve the bondability between the fine metal wires and inner leads. However, as adhesiveness between the precious metal film and encapsulating plastic is not good, the interface between the inner lead with precious metal film applied thereto and the encapsulating plastic is subjected to debonding. Therefore, the region for the application of precious metal film 14 to the signal inner lead 4 should be limited only to the leading end of the signal inner lead 4 where the fine metal wire is connected.

However, for the common signal inner lead 3, the precious metal film 14 is applied to the entire area of the common signal inner lead 3 positioned above the insulating member 2 because a large number of fine metal wires are to be connected over wide area of the common signal inner lead 3. In this respect, the hatched portion in FIG. 17 indicates the region where the precious metal film 14 is applied.

In a plastic encapsulated semiconductor device, the linear expansion coefficients of semiconductor chip, inner lead, insulating member, and encapsulating plastic, which constitute the device, usually differ from one another, thus generating thermal stresses in the device due to temperature changes therein. Particularly a great stress is generated in the upper part of the common signal inner lead due to the interfacial debonding between encapsulating plastic and the common signal inner lead and that between encapsulating plastic and the insulating member. This causes plastic cracking to occur from this portion.

Figure 19:
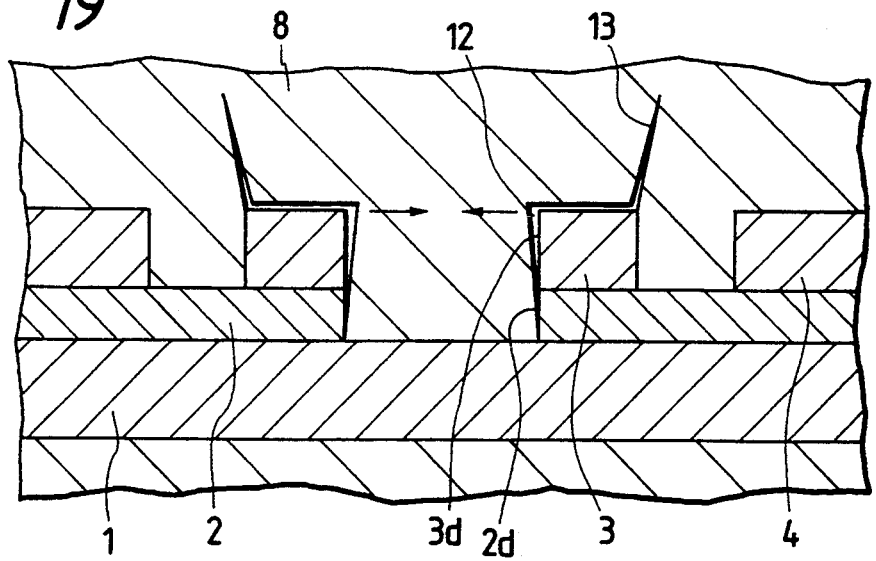
FIG. 19 is a partially cross-sectional view illustrating a mechanism of plastic cracking occurrence.

FIG. 19 is a cross-sectional view illustrating a model of plastic cracking mechanism. Because there is a great difference in the linear expansion coefficients between the common signal inner lead (linear expansion coefficient $5 \times 10^{-6}/°C.$) and encapsulating plastic (linear expansion coefficient approximately $20 \times 10^{-6}/°C.$), the poorly adhesive interface between the common signal inner lead 3 and encapsulating plastic 8 is easily debonded due to cooling after plastic encapsulation of the semiconductor or temperature drop during the temperature cycling testing, as indicated by a numeral 12. Here, for example, the thickness of semiconductor chip 1 is approximately 0.4 mm, that of insulating member 2 is 0.15–0.2 mm, and the thickness of each of the inner leads is approximately 0.2 mm. Then if debonding 12 should occur, plastic is contracted in the central direction indicated by an arrow in FIG. 19. Consequently debonding 12 also occurs on the interface between plastic and the side 2d of insulating member which is placed almost at the same position as the side 3d of common signal inner lead. As the debonding portion 12 is extended, the deformation of plastic above the common signal inner lead is increased to generate a great stress at the upper edge of the common signal inner lead 3. Thus plastic cracking 13 occurs at this portion. The plastic cracking 13 thus occurring in the upper edge of the common signal inner lead 3 not only spoils the external appearance of semiconductor device but presents a problem that the fine metal wires 7 electrically connecting the common signal inner lead 3 or signal inner lead 4 to the semiconductor chip 1 are broken.

With each of the above embodiments according to the present invention, it is possible to reliably prevent the occurrence or development of an interfacial debonding such as this.

(Thirteenth Embodiment)

Figure 20:
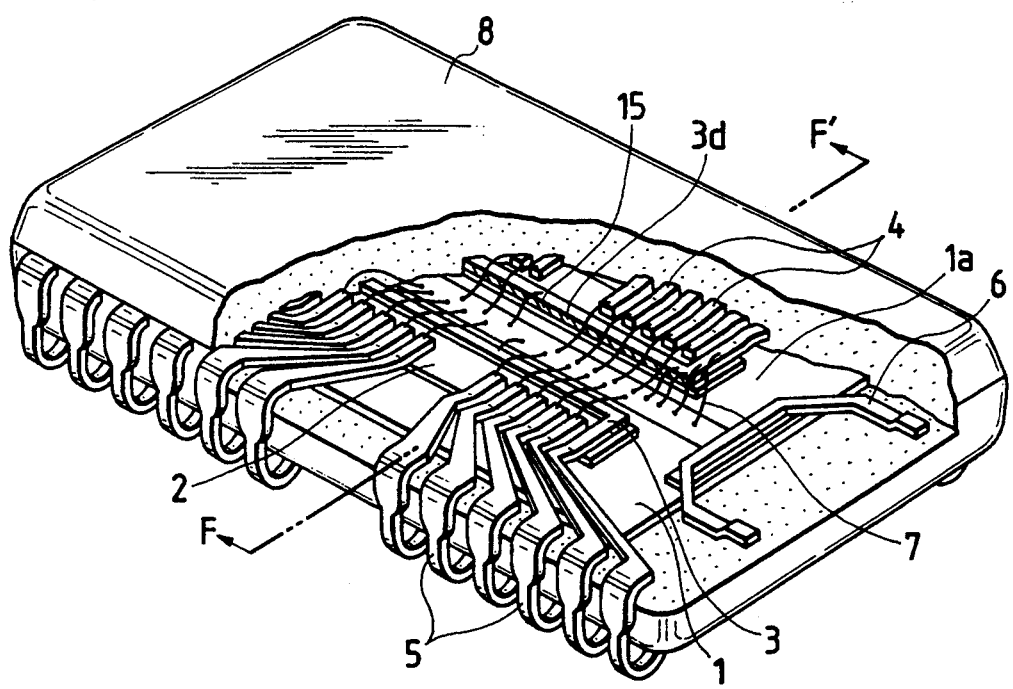
FIG. 20 is a partially sectional perspective view showing a thirteenth embodiment of a plastic encapsulated semiconductor device according to the present invention.
Figure 21:
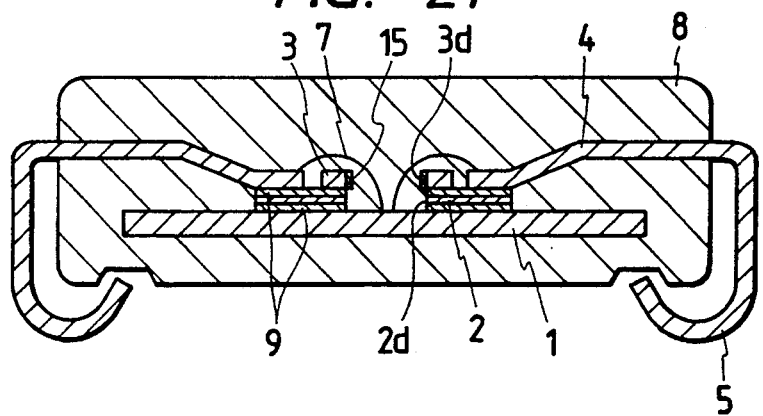
FIG. 21 is a cross-sectional view taken along the line F—F' of FIG. 20.

FIG. 20 is a partially sectional perspective view showing an embodiment according to the present invention and FIG. 21 is a cross-sectional view taken at the line F—F' of FIG. 20.

In the figures, the ends of the common signal inner lead 3 and signal inner lead 4 are integratedly formed with the outer leads 5, and the outer leads 5 are arranged in the two directions (longitudinal face) of the plastic encapsulated semiconductor device.

The common signal inner lead 3 is extended in the central part of semiconductor chip 1 in parallel with the longer side thereof and is electrically connected to the semiconductor chip 1 on the circuit formation face 1a of semiconductor chip 1 by fine metal wires 7. While the circuit formation face 1a is mostly covered with a passivation film of PIQ, etc., this region of the electrically connected portion of the circuit formation face is exposed without the passivation film. Further the signal inner lead 4 is extended to the central part of the semiconductor chip 1 across each of the longer sides of the oblong semiconductor chip 1 and the leading end thereof is electrically connected to the semiconductor chip 1 on the circuit formation face 1a of semiconductor chip 1 by fine metal wires 7. Thus the major portions themselves of two common signal inner leads 3 face each other.

Between the lower faces of the common signal inner lead 3 and signal inner lead 4, and the circuit formation face 1a of semiconductor chip 1, a sheet insulating member 2 is provided to electrically insulate the common signal inner lead 3 and signal inner lead 4 from the semiconductor chip 1. The insulating member 2 is bonded to the semiconductor chip 1 by adhesive 9. In this respect, the side end (opposing faces) 2d of the insulating member 2 in this example is directly in contact with plastic 8 without adhesive 9. A film 15 having a good adhesiveness to encapsulating plastic 8 is formed on the side end (opposing faces) 3d of the common signal inner lead 3, and is in contact with encapsulating plastic 8.

In this respect, the hatched portion in FIG. 20 indicates the region where the film 15 is formed.

The common signal inner lead 3 and signal inner lead 4 are bonded to the insulating member 2 by adhesive 9.

In the present embodiment, semiconductor chip 1, insulating member 2, common signal inner lead 3, signal inner lead 4 and fine metal wires 7 are encapsulated with plastic 8 to configurate a semiconductor device.

According to the present embodiment, it is possible to prevent the debonding which has occurred on the side 2d of the insulating member 2 from propagating to the side 3d of the common signal inner lead 3 by forming film 15 having a good adhesiveness to encapsulating plastic 8 on the side 3d of the common signal inner lead 3.

Thus the deformation of plastic 8 above the common signal inner lead 3 caused by the cooling of semiconductor device after plastic encapsulation or the temperature drop at the time of temperature cycling test can be reduced and no great stress is generated in the upper part of the common signal inner lead 3. Therefore, the occurrence of plastic cracking from this portion can be prevented.

The bonding of the circuit formation face 1a of semiconductor chip 1 to the insulating member 2, and the bondings of the insulating member 2 to common signal inner lead 3, the insulating member 2 to signal inner lead 4, and the insulating member 2 to supporting inner lead 6 are performed by adhesive 9 as shown in FIG. 21. In this respect, however, no problem arises even if the common signal inner lead 3 is not bonded to the insulating member 2.

It is desirable to minimize the bonding area between the insulating member 2 and the semiconductor chip 1, common signal inner lead 3 or signal inner lead 4 to an extent that the bondings of the fine metal wires 7 are stably and reliably made and the area can withstand the external forces exerted at the time of connection by fine metal wires 7 and encapsulation process with plastic 8.

Subsequently a method will be described for bonding the common signal inner lead 3, signal inner lead 4, and supporting inner lead 6 to the semiconductor chip 1 using adhesive 9 with the insulating member 2 included therebetween. On the places of the circuit formation face 1a of semiconductor chip 1, each facing the common signal inner lead 3, signal inner lead 4, and supporting inner lead 6 respectively, divided insulating members 2 are affixed by adhesive 9. Then the common signal inner lead 3, signal inner lead 4, and supporting inner lead 6 are fixedly bonded to the circuit formation face 1a of semiconductor chip 1 by adhesive 9 through the insulating member 2.

For the insulating member 2, epoxy resin, bismaleimidetriazine resin, phenolic resin, polyimide resin, etc. are used, and for adhesive 9, a material such as epoxy, polyether amide, polyimide precursor, and epoxy modified polyimide is used.

While the common signal inner lead 3, signal inner lead 4, and supporting inner lead 6 are connected together until encapsulated by plastic 8 to form a series of lead frames, these are cut and separated, and then formed after plastic encapsulation. The lead frame is made of, for example, Fe-Ni alloy (Fe-42Ni, etc.), Cu and others.

For the fine metal wire 7, a fine wire made of aluminum (Al), gold (Au), copper (Cu), or the like is employed.

For encapsulating plastic 8, epoxy resins with phenol hardening agent, silicone rubber and inorganic filler are used.

The films 15, which are formed on the opposing faces 3d of common signal inner leads 3, are composed of an organic material such as epoxy, polyether amide, and epoxy modified polyimide, or metals such as Cu, and is bonded by a plating method, thin film forming method, or thick film forming method such as coating, etc.

The direction in which the outer lead 5 is drawn to the outside of the plastic 8 is not limited to the two directions as shown in FIG. 20, i.e., the longer sides of the plastic encapsulated semiconductor device, but may be one direction only or three or more directions. Also, the outer lead 5 can be drawn not only from the side end of the plastic 8 but either from the upper end or bottom end of the plastic 8. In the figures, the outer lead 5 is bent down, and the leading end thereof is bent downwards to the bottom face of the plastic 8, which represents an example of J type bend. The outer lead 5, however, can be bent down in an arbitrary direction and shape or it can be arranged without a bent.

(Fourteenth Embodiment)

Figure 22:
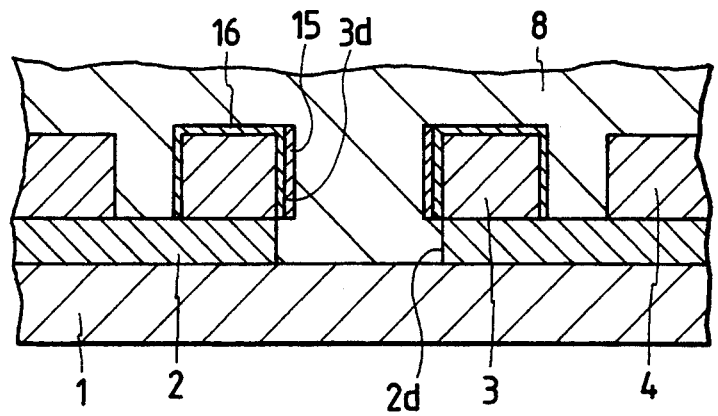
FIG. 22 is an enlarged cross-sectional view showing a fourteenth embodiment of a plastic encapsulated semiconductor device according to the present invention.

In the embodiment shown in FIG. 20 and FIG. 21, the film 15 is affixed to the surface of the base material of the common signal inner lead 3, but as shown in FIG. 22, it may also be possible to affix the film 15 over a precious metal film 16 of Au or Ag formed on the surface of the base material of the common signal inner lead 3.

In the above embodiments, the common signal inner lead 3 and signal inner lead 4 are separately indicated. The present invention, however, is applicable without departing from the scope thereof to a semiconductor device such that the common signal inner lead 3 and signal inner lead 4 are not separated or to a semiconductor device such that the common signal inner lead 3 is not provided.

(Fifteenth Embodiment)

Figure 23:
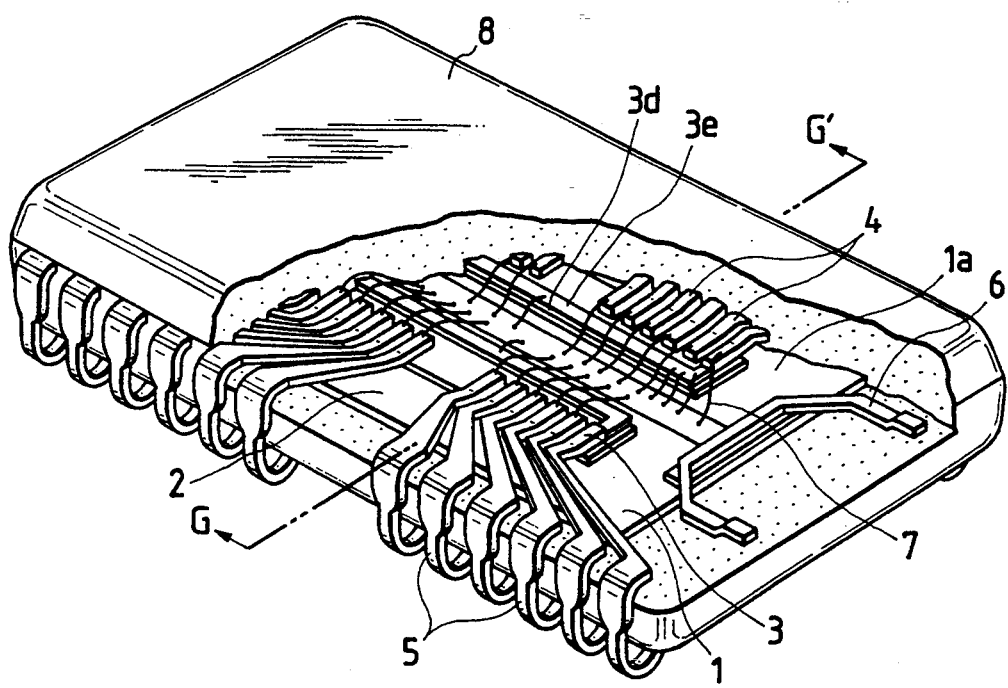
FIG. 23 is a partially sectional perspective view showing a fifteenth embodiment of a plastic encapsulated semiconductor device according to the present invention.
Figure 24:
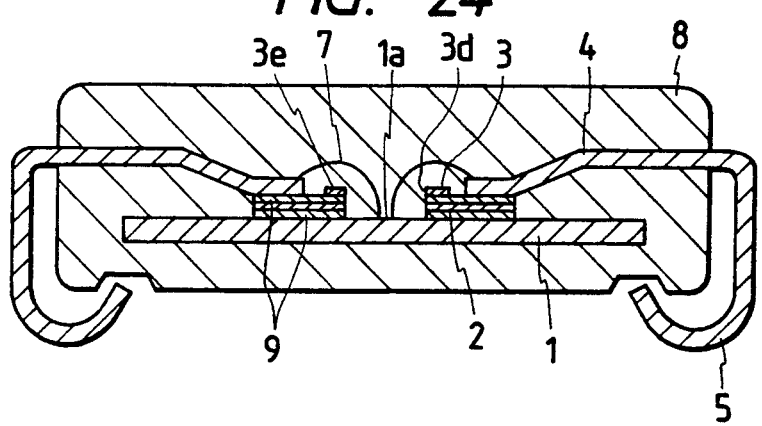
FIG. 24 is a cross-sectional view taken along the line G—G' of FIG. 23.

FIG. 23 and FIG. 24 show another embodiment according to the present invention. FIG. 24 is a cross-sectional view taken along the line G—G' of FIG. 23. The present embodiment differs from those hitherto described in that a thinned portion 3e is provided in the common signal inner lead 3 arranged above the insulating member 2. Thus the length of debonding becomes shorter even if an interfacial debonding should occur between the opposing face (side) 3d of the common signal inner lead 3 and encapsulation plastic 8, thereby reducing the deformation of plastic above the common signal inner lead. Accordingly the stress generated at the upper edge of the common signal inner lead can be lowered.

The thinned portion 3e of common signal inner lead is formed by etching or machining, press, etc. Also, the thinned portion 3e may be formed with a material different from that used for the other portion of the common signal inner lead 3. The thickness of thinned portion 3e should desirably be the thinnest that can be manufactured within an allowable limit for the fine metal wires to be connected.

The connection of the common signal inner lead 3 to fine metal wires 7 can possibly be made on the thinned portion 3e. In this case, the thinned portion 3e should desirably be plated with Ag.

While the embodiment shown in FIG. 23 shows an example of providing the thinned portion 3e continuously in a wide area, it may be possible to provide a thinned portion in a location other than the connecting part of the common signal lead 3 and fine metal wires 7.

(Sixteenth Embodiment)

Figure 25:
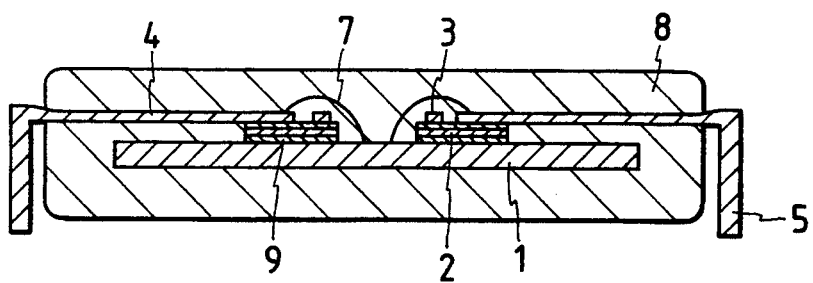
FIG. 25 is a cross-sectional view showing a sixteenth embodiment of a plastic encapsulated semiconductor device according to the present invention.

FIG. 25 is a cross-sectional view showing a sixteenth embodiment according to the present invention. The present embodiment differs from those hitherto described in that the common signal inner lead 3 and signal inner lead 4, which are both in the encapsulated body of plastic 8, are made thinner than the outer leads 5. Thus the stress generated at the upper edge of the common signal inner lead can be reduced at the same time of obtaining an effect to achieve thinning a semiconductor device. It is desirable to minimize the thicknesses of the common signal inner lead 3 and signal inner lead 4 as long as those can be manufactured within an allowable limit to permit fine metal wire connection.

(Seventeenth Embodiment)

Figure 26:
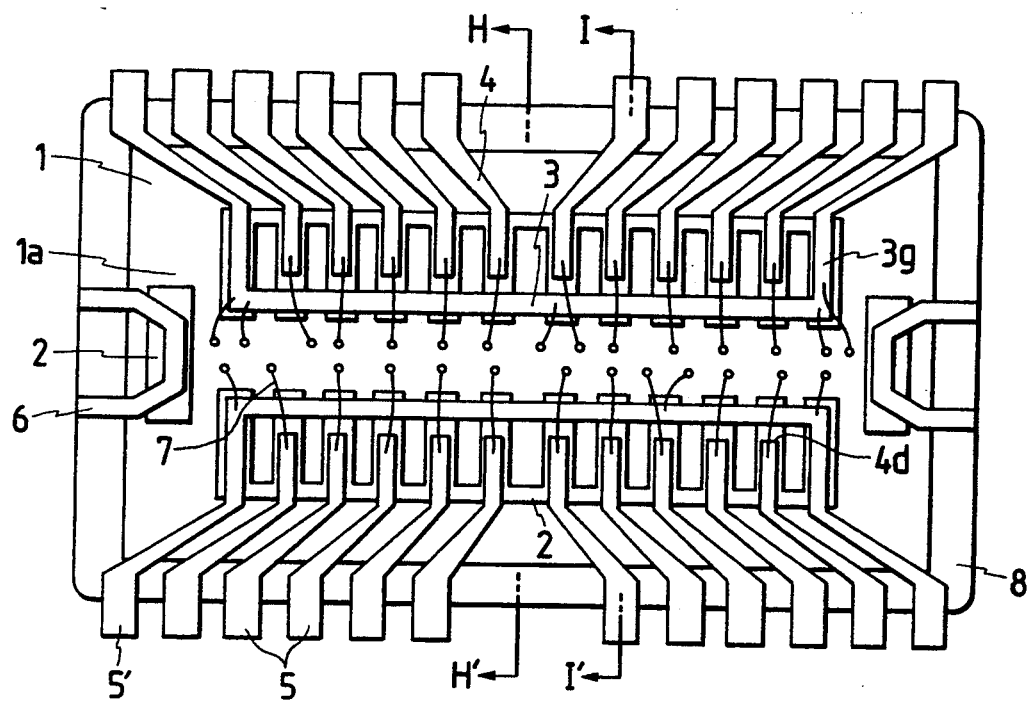
FIG. 26 is a plane view taken without the upper plastic of a semiconductor chip illustrating a seventeenth embodiment of a plastic encapsulated semiconductor device according to the present invention.
Figure 27:
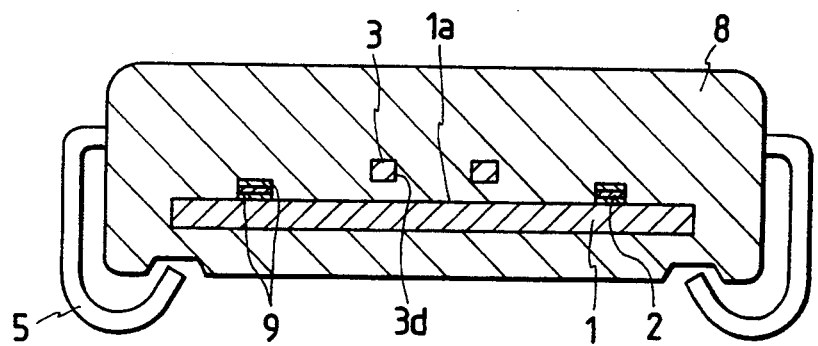
FIG. 27 is a cross-sectional view taken along the line H—H' of FIG. 26.
Figure 28:
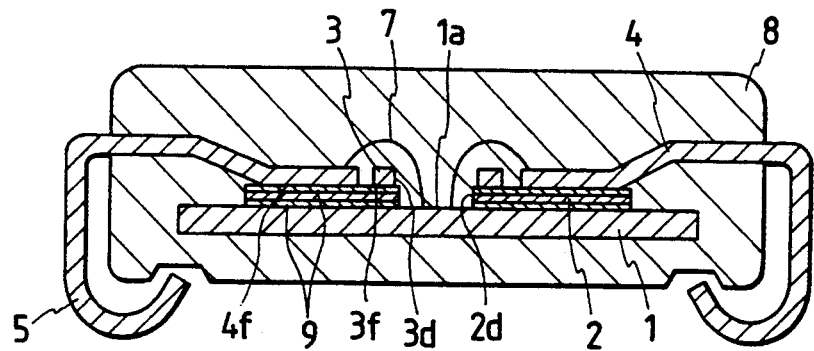
FIG. 28 is a cross-sectional view taken along the line I—I' of FIG. 26.

FIG. 26 is a plane view taken without the upper plastic of the circuit formation face of semiconductor chip of a plastic encapsulated semiconductor device according to the present invention. FIG. 27 is a cross-sectional view taken along the line H—H' of FIG. 26, and FIG. 28 is a cross-sectional view taken along the line I—I' of FIG. 26.

In the figures, the common signal inner lead 3 and signal inner lead 4 are integrally formed with outer leads 5 and 5' at the one ends thereof, and the outer leads 5 and 5' are arranged in the two directions (longitudinal face) of the plastic encapsulated semiconductor device.

The common signal inner lead 3 is extended in the central part of semiconductor chip 1 in parallel with the longer side thereof, and is electrically connected to the semiconductor chip 1 by fine metal wires 7 on the circuit formation face 1a of semiconductor chip 1. The circuit formation face 1a is mostly covered with a passivation film such as PIQ, etc. However, this region for the electrical connection is not covered with the passivation film, and the circuit formation face is exposed. Also, the signal inner lead 4 is extended to the central portion of the semiconductor chip 1 across each of the longer sides of the oblong semiconductor chip 1, and the leading end thereof is electrically connected to the semiconductor chip 1 by fine metal wires 7 on the circuit formation face 1a of semiconductor chip 1. In this way, the major portions of two common signal inner leads 3 face each other.

A sheet insulating member 2 is provided between the circuit formation face 1a of semiconductor chip 1 and the lower face 3f of common signal inner lead 3 and lower face 4f of signal inner lead 4 to electrically insulate the common signal inner lead 3 and signal inner lead 4 from the semiconductor chip 1. The insulating member 2 is extendedly and integrally provided immediately beneath the signal inner lead 4; immediately beneath the common signal inner lead 3 at the extended portion of the leading end 4d of signal inner lead 4 in the central side of the semiconductor chip; and at the end 3g of the major portion of common signal inner lead 3. In the region immediately beneath the common signal inner lead 3 where no insulating member 2 is provided, plastic 8 is included.

The insulating member 2 is bonded to the semiconductor chip 1 by adhesive 9. Also, the common signal inner lead 3 and signal inner lead 4 are respectively bonded to the insulating member 2 by adhesive 9.

The connection between the common signal inner lead 3 and fine metal wires 7 is made at a portion where the insulating member 2 is arranged immediately beneath the common signal inner lead 3.

In the present embodiment, the semiconductor chip 1, insulating member 2, common signal inner lead 3, signal inner lead 4, and fine metal wires 7 are encapsulated with plastic 8 to configurate the semiconductor device.

According to the present embodiment, with the inclusion of plastic 8 immediately beneath the common signal inner lead 3 on the circuit formation face 1a of semiconductor chip 1, the development of interfacial debonding is prevented by plastic if the interfacial debonding which has occurred in the side 3d of common signal inner lead 3 should develop into the side 2d of insulating member 2. Thus the deformation of plastic 8 above the common signal inner lead 3 caused by the cooling of semiconductor device after plastic encapsulation or the temperature drop at the time of temperature cycling test can be reduced and no great stress is generated at the upper edge of the common signal inner lead 3. As a result, the plastic cracking from this portion can be prevented.

It is desirable to minimize the bonding area between insulating member 2 and the semiconductor chip 1, common signal inner lead 3, or signal inner lead 4 to an extent that the stable and reliable connection of fine metal wires 7 can be made and that the areas can withstand the external forces exerted at the time of the connection of fine metal wires 7 and encapsulation process of plastic 8.

Subsequently a method will be described for bonding the common inner lead 3, signal inner lead 4, and supporting inner lead 6 to the circuit formation face 1a of semiconductor chip 1 using adhesive 9 with the insulating member 2 included therebetween. On the places of the circuit formation face 1a of semiconductor chip 1, each facing the common signal inner lead 3, signal inner lead 4, and supporting inner lead 6 respectively, divided sheet insulating members 2 are affixed by adhesive 9. Then the common signal inner lead 3, signal inner lead 4, and supporting inner lead 6 are fixedly bonded to the circuit formation face 1a of semiconductor chip 1 by adhesive 9 through the insulating members 2.

For the insulating member 2, a material made of one kind or a plurality of resins selected from epoxy resins, bismaleimidetriazine resin, phenolic resin, polyimide resin, etc. as main components with inorganic filler and various additives added as required is employed. Also, for adhesive 9, a material such as epoxy resin, polyimide resin, silicone resin, aromatic polyetheramide and polyetherether ketone is used, for example.

While the common signal inner lead 3, signal inner lead 4, and supporting inner lead 6 are connected with each other until encapsulated with plastic 8 to form a series of lead frames, these are cut and separated, and then formed after plastic encapsulation. The lead frame is made of, for example, Fe-Ni alloy (Fe-42Ni, etc.), Cu and others.

For the fine metal wire 7, a fine wire made of aluminum (Al), gold (Au), or Copper (Cu) or others is employed.

For encapsulating plastic 8, epoxy resins with phenol hardening agent, silicone rubber, and inorganic filler are used. In addition, a slight amount of additives such as flame retardent, coupling agent, coloring agent is added. The filler is composed of silicon oxide granules.

The direction in which the outer leads 5 are drawn to the outside is not limited to the two directions shown in FIG. 26, i.e., the longer sides of plastic encapsulated semiconductor device, but the direction can be only one or three or more. Also, the outer leads 5 can be drawn not only from the side of plastic 8 but also either from the upper face or bottom face of the plastic 8. Further in the figure, the outer lead is bent down and the leading end of outer lead 5 is bent down towards the bottom face of plastic 8 to represent an example of J bend type, but it can be bent in an arbitrary direction and shape or it can be arranged without any bend.

(Eighteenth Embodiment)

Figure 29:
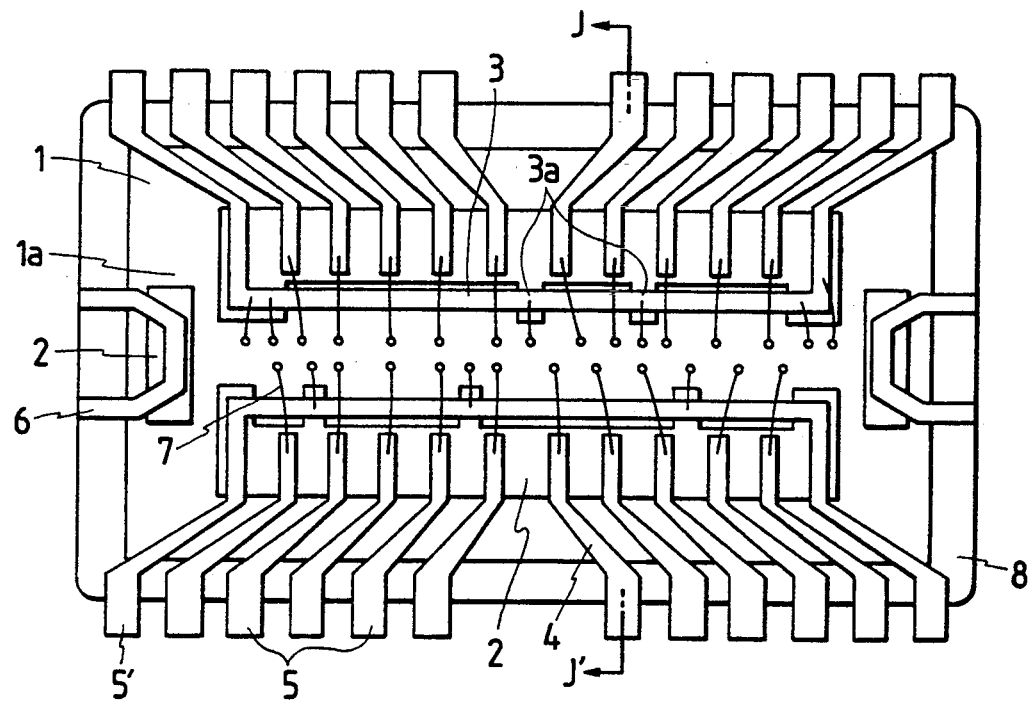
FIG. 29 is a plane view taken without the upper plastic of a semiconductor chip illustrating a eighteenth embodiment of a plastic encapsulated semiconductor device according to the present invention.
Figure 30:
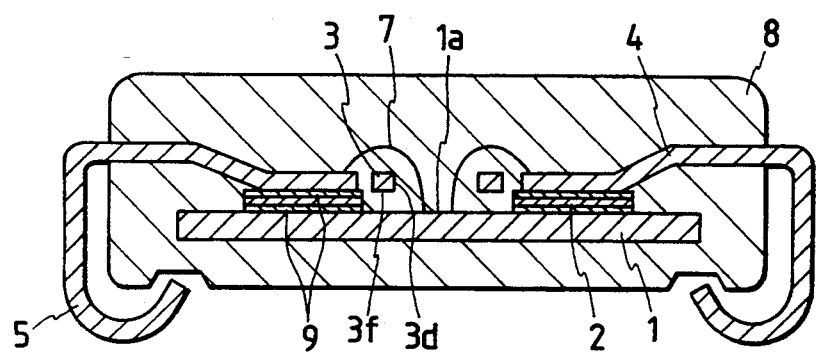
FIG. 30 is a cross-sectional view taken along the line J—J' of FIG. 29.

FIG. 29 is a plane view taken without the upper plastic of circuit formation face of semiconductor chip of a plastic encapsulated semiconductor device according to the present invention, and FIG. 30 is a cross-sectional view taken along the line J—J' of FIG. 29.

In the figures, plastic 8 is included without the insulating member 2 in the region other than that immediately beneath the connecting part of fine metal wire 3a of common signal inner lead 3. In the embodiment shown in FIG. 26, an example is mentioned to explain that plastic 8 is included between the signal inner leads 4 themselves in such a manner that the plastic is in contact with the circuit formation face 1a of semiconductor chip 1, in addition to being applied to the portion immediately beneath the common signal inner lead 3. As shown in the present embodiment, however, it may be possible to implement the inclusion of the plastic 8 only immediately beneath the common signal inner lead 3.

According to the present embodiment, it is also possible to prevent the development of interfacial debonding by the application of plastic if the interfacial debonding which has occurred in the side 3d of the common signal inner lead 3 should develop into the side 2d of the insulating member 2. Thus the deformation of plastic 8 above the common signal inner lead 3 can be reduced, so that no great stress is generated at the upper edge of the common signal inner lead 3. Accordingly resin cracking from this portion can be prevented.

With each of the embodiments according to the present invention set forth above, the occurrence and development of an interfacial debonding such as those can reliably be prevented and at the same time, the stress causing such occurrence can be reduced.

It is readily understood that each of the above embodiments can appropriately be combined in implementation without any problem.

What is claimed is:

1. A plastic encapsulated semiconductor device in which at least on two places on the circuit formation face of a semiconductor chip with a circuit being formed thereon, insulating films are bonded, wherein above each of said insulating films, first inner leads for electrical connection are positioned, so that said first inner leads for electrical connection are arranged to face each other, wherein a plurality of second electric signal inner leads are further arranged in positions apart from said first inner leads for electrical connection wherein the semiconductor chip, the insulating films, the first inner leads for electrical connection and the second electric signal inner leads are encapsulated with plastic, and wherein the positions of each of the opposing faces of said insulating films themselves and each of the opposing faces of said first inner leads for electrical connection are arranged so as not to be aligned with each other.

2. A plastic encapsulated semiconductor device according to claim 1, wherein the major portion of each of said first inner leads for electrical connection is respectively arranged in the longitudinal direction of said semiconductor chip, so that the sides of said major portions form the opposing faces of said first inner leads for electrical connection.

3. A plastic encapsulated semiconductor device according to claim 2, wherein said second electrical signal inner leads are positioned at a location closer to outside peripheral edges of the semiconductor chip than said first inner leads for electrical connection.

4. A plastic encapsulated semiconductor device in which an insulating member is bonded to the circuit formation face of a semiconductor chip supported by a first supporting inner lead wherein second inner leads for electrical connection are arranged above said insulating member, wherein said second inner leads for electrical connection and said semiconductor chip are electrically connected respectively by fine metal wires, wherein the circumference of the semiconductor device is encapsulated with encapsulating plastic, wherein the second inner leads for electrical connection are arranged upwardly apart from said insulating member, and wherein said encapsulating plastic is included between said insulating member and the second inner leads for electrical connection.

5. A plastic encapsulated semiconductor device in which an insulating member is bonded to the circuit formation face of a semiconductor chip, wherein common signal inner leads and signal inner leads are arranged above said insulating member; said common signal inner leads and said signal inner leads are connected to said semiconductor chip respectively by fine metal wires; and the circumference of the semiconductor device is encapsulated with encapsulating plastic, wherein said signal inner leads are bonded to said insulating member, and wherein said common signal inner leads are arranged upwardly apart from said insulating member with said encapsulating plastic included between the common signal inner leads and said insulating member.

6. A plastic encapsulated semiconductor device in which common signal inner leads and a plurality of signal inner leads are bonded by adhesive on the circuit formation face of a semiconductor chip through an insulating member for electrically insulating said semiconductor chip from both the common signal inner leads and the signal inner leads, wherein said common signal inner leads and said signal inner leads are electrically connected to said semiconductor chip respectively by fine metal wires, wherein the circumference of said semiconductor device is encapsulated with encapsulating plastic to form a plastic encapsulated body, wherein portions directly below the common signal inner leads intersecting imaginary extensions of said signal inner leads extended from the periphery to the inside of said semiconductor chip are formed of said insulating member, and wherein said encapsulating plastic intervenes in portions directly below the common signal inner leads excepting said intersecting portions.

7. A plastic encapsulated semiconductor device according to claim 6, wherein the encapsulating plastic in the regions immediately beneath said common signal inner leads is in contact both with the circuit formation face of said semiconductor chip and said common signal inner leads.

8. A plastic encapsulated semiconductor device according to claim 6, wherein said encapsulating plastic is included in the region sandwiched by the sides of said signal inner leads in such a manner that the encapsulating plastic is in contact with the circuit formation face of said semiconductor chip and the sides of said signal inner leads.

9. A lead frame having an aggregate of leads each comprising a first inner lead section for electrical connection and a second inner lead section arranged to support a semiconductor chip in a plastic encapsulated body, and an outer lead section located outside the plastic encapsulated body, wherein the portion of said inner lead section for electrical connection arranged at least on an insulating member bonded on the circuit formation face of a semiconductor chip is positioned upwardly apart from said insulating member.

10. A lead frame having an aggregate of leads each comprising a common signal inner lead section and signal inner lead section in a plastic encapsulated body and an outer lead section located outside the plastic encapsulated body, wherein the portion of said common signal inner lead section for electrical connection arranged at least on an insulating member bonded on the circuit formation face of a semiconductor chip is positioned upwardly apart from said insulating member.

* * * * *